(12) United States Patent
Katoh et al.

(10) Patent No.: US 7,473,014 B2
(45) Date of Patent: Jan. 6, 2009

(54) LIGHT EMITTING DIODE LAMP AND LIGHT EMITTING DIODE DISPLAY UNIT

(75) Inventors: Masaaki Katoh, Osaka (JP); Masatoshi Omoto, Osaka (JP); Masataka Miyata, Yamatotakada (JP); Keiji Takasugi, Yamatokooriyama (JP); Masahiro Seko, Kitakatsuragi-Gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 11/246,236

(22) Filed: Oct. 11, 2005

(65) Prior Publication Data

US 2006/0039143 A1   Feb. 23, 2006

Related U.S. Application Data

(63) Continuation of application No. 10/621,265, filed on Jul. 17, 2003, now abandoned.

(30) Foreign Application Priority Data

| Jul. 17, 2002 | (JP) | ............................ P2002-208352 |
| May 15, 2003 | (JP) | ............................ P2003-137618 |

(51) Int. Cl.
   *F21V 5/00*   (2006.01)
(52) U.S. Cl. ...................... 362/332; 362/235; 362/311; 362/327; 362/800
(58) Field of Classification Search ................ 362/235, 362/311, 326–327, 332, 800
   See application file for complete search history.

(56) References Cited

U.S. PATENT DOCUMENTS

| 3,609,475 | A | * | 9/1971 | Kaposhilin | .................... 257/99 |
| 4,774,434 | A | * | 9/1988 | Bennion | ...................... 313/500 |
| 5,013,144 | A | * | 5/1991 | Silverglate et al. | .......... 359/709 |
| 5,289,082 | A | * | 2/1994 | Komoto | ...................... 313/500 |
| 5,298,768 | A | * | 3/1994 | Okazaki et al. | ................ 257/81 |
| 5,924,788 | A | * | 7/1999 | Parkyn, Jr. | ................... 362/329 |
| 6,586,874 | B1 | * | 7/2003 | Komoto et al. | .............. 313/503 |
| 6,614,179 | B1 | * | 9/2003 | Shimizu et al. | ............. 313/512 |

FOREIGN PATENT DOCUMENTS

| JP | 60070783 | A | * | 4/1985 |
| JP | 62-055973 | | * | 3/1987 |
| JP | 05-121785 | | * | 5/1993 |
| JP | 05-275752 | | * | 10/1993 |
| JP | 6-177424 | | | 6/1994 |
| JP | 07131074 | A | * | 5/1995 |
| JP | 08-162673 | | * | 6/1996 |
| JP | 10-22529 | | | 1/1998 |
| JP | 11-154766 | | | 6/1999 |

* cited by examiner

*Primary Examiner*—Sandra O'Shea
*Assistant Examiner*—Jason Moon Han
(74) *Attorney, Agent, or Firm*—Morrison & Foerster LLP

(57) ABSTRACT

An LED lamp has a convex lens 3 which has an upper portion 5 and a lower portion 6. An upper curved surface 5A of the upper portion is different in shape from a lower curved surface 6A of the lower portion 6 so as to refract rays of light from an LED chip 2 more strongly than the lower curved surface 6A does. This avoids reflection of incident outside light toward a front and hence prevents misrecognition. An interface plane S1 between the upper and lower portions 5 and 6 of the convex lens 3 is located on an upper end face 2A to thereby prevent collection of outgoing light upon the interface plane S1 and generation of an irregular emission peak at the front.

21 Claims, 12 Drawing Sheets

LIGHT EMITTING DIODE LAMP AND LIGHT EMITTING DIODE DISPLAY UNIT

BACKGROUND OF THE INVENTION

The present invention relates to a light emitting diode ("LED") lamp and an LED display unit, which are preferably used, for example, in outdoor LED display boards for displaying road information such as traffic information as well as for outdoor display for advertisement, signalers and the like.

Conventionally, there has been an LED lamp shown in FIG. 10. This LED lamp is structured such that an LED chip 102 mounted on a lead frame 101 is resin-molded and embedded in a resin lens 103. The resin lens 103 has a curved surface 103A that is curved in a convex shape in the light emitting direction of the LED chip 102 (see Japanese Patent Laid-Open Publication HEI 11-154766 and Japanese Patent Laid-Open Publication HEI 10-22529, for example).

The conventional LED lamp shown in FIG. 10 produces a phenomenon, when used in an outdoor LED display board for example, that in the evening and early morning when an irradiation angle of sunlight is low, sunlight directly comes incident upon the LED lamp and gives the unlit LED lamp the appearance as if it is lit. This phenomenon lessens a contrast ratio of a lit LED lamp to an unlit LED lamp, which may make the LED display board less recognizable. This phenomenon, which is similar to misread of signalers due to afternoon sunlight, causes remarkable deterioration of display quality of the LED display board that constitutes electronic billboards, signboards, and the like.

With reference to FIG. 12, more detailed description will be given of the above-stated phenomenon of the conventional LED lamp. When the rays of sunlight 111a, 111b with low irradiation angles in the evening and early morning, as shown in FIG. 12, become incident upon a resin lens 103, they are refracted by a curved surface 103A of the resin lens 103, so that their traveling directions approximate to normal lines L101, L102 at incident points P101, P102. By this refraction, the rays of sunlight 111a, 111b are incident upon and reflected by a portion of a lead frame 101 on or around which an LED chip 102 is mounted, as a consequence of which, at an incident angle close to the emission angle of the emitted rays of light from the LED chip 102, the reflected rays of light 111a, 111b comes incident upon and refracted by the curved surface 103A of the resin lens 103, and therefore the refracted rays of light exits in approximately parallel to an exit optical axis J101. This is the phenomenon that an unlit LED lamp looks like a lit LED lamp.

Next, another conventional example is shown in FIG. 11. This conventional example is similar to the above-described conventional example in that an LED chip 102 is mounted on a lead frame 101, but different in that there is provided a lens 105 having upper and lower curved surfaces 105A and 105B whose shapes are different from each other (see Japanese Patent Laid-Open Publication HEI 11-154766 for example). If the upper and lower curved surfaces are considerably different in curvature as with this conventional example, rays of light are concentrated upon an interface of these two curved lens surfaces 105A, 105B, which generates an irregular emission peak on the front side. Consequently, the apparent luminescence intensity becomes remarkably different between a view from the front side and a view with a viewpoint slightly displaced downward from the front side, thereby causing degradation of display quality.

Also, when the positional relationship between the light emitting diode chip and the interface of the lenses is changed due to production variations, the emission angle at the above-mentioned emission peak varies, so that particularly an LED display board composed of a lot of light emitting diode lamps disposed in a matrix form produces uneven display when viewed from the front side.

In the former conventional example as described above, the installation site of the LED display board should be taken into consideration. In the places exposed to afternoon sunlight, the board cannot be installed at all or should be installed with the display surface of the LED display board inclined downward. Therefore, particularly in the case of traffic information boards, there have been cases in which the conventional board could not be applied as a display board whose original function is to secure traffic safety.

Also, as is the case with the latter conventional example, simple combination of upper and lower lenses with different curvatures produces uneven display as viewed from the front-side direction.

SUMMARY OF THE INVENTION

Accordingly, it is an object of the present invention to provide an LED lamp and an LED display unit capable of preventing misrecognition due to incident rays of light from the outside, such as reflected rays of sunlight, without causing uneven display.

In order to achieve the above object, an LED lamp according to one aspect of the present invention includes at least one LED chip, and a convex lens through which rays of light emitted from the at least one LED chip pass. The convex lens has two different curved surfaces on both sides of a plane orthogonal to a light emitting surface of the LED chip or to an extension of the light emitting surface and extending off a center of the light emitting surface, and one of the curved surfaces of the convex lens is a curved surface that refracts outgoing rays of light from the LED chip more greatly than the other of the curved surfaces of the convex lens does.

This LED lamp of the present invention is structured such that the curved surface on one side of the convex lens is different in shape from the curved surface on the other side of the convex lens and refracts rays of light emitted from the LED chip larger than the other-side curved surface does. An outside ray of light that comes incident at a shallow angle (as typified by afternoon light and the like) upon the other-side curved surface of the convex lens is refracted and reaches the vicinity of the location where the LED chip is mounted, and on this location the ray of light is reflected and comes incident from the inside upon the one-side curved surface. The outside ray of light incident upon the one-side curved surface is steeply refracted by the one-side curved surface and emitted toward the other side. If that outside ray of light comes incident from the inside upon the one-side curved surface at an incident angle beyond a critical angle, the outside ray of light is totally reflected by the one-side curved surface and does not exit from the convex lens. It should be noted that the one-side curved surface refracts the outgoing rays of light, which are emitted from the LED chip and have an identical outgoing angle, larger than the other-side curved surface does. Herein, one side may be set as the upper side and the other side may be set as the lower side, for example.

Accordingly in the present invention, if outside rays of light come incident, reflection of the outside rays of light to the front side is avoidable, and therefore misrecognition of an unlit diode lamp as being lit is prevented.

Further in the present invention, since the curved surfaces are disposed on one side and the other side of a plane extending off the center of the light emitting surface, outgoing rays of light from the LED chip are prevented from concentrating upon a plane extending through the center of the light emitting surface, thereby enabling prevention of an irregular light emitting peak from being produced on the front side. This makes it possible to avoid a phenomenon of rapid decline of luminous intensity only with slight displacement of a viewpoint from the front side. According to the present invention, therefore, misrecognition due to incident rays of light from the outside, such as reflected rays of light, can be prevented without causing uneven display.

In one embodiment, the plane extending off a center of the light emitting surface is orthogonal to the extension of the light emitting surface of the LED chip and does not intersect with the LED chip.

In this embodiment, outgoing rays of light from the LED chip can be more securely prevented from concentrating upon the plane going through the center of the light emitting surface, which ensures prevention of uneven display, thereby enabling increase of display quality.

In one embodiment, the LED lamp has more than one LED chips, which are arrayed in one direction.

In the LED lamp of the present embodiment, a plurality of LED chips are arrayed in one direction, which makes it possible to increase luminance while uneven display and misrecognition being prevented. Also, by arranging the LED chips so as to emit rays of light having wavelengths different from each other, a multicolor LED lamp is implemented.

In one embodiment, the at least one LED chip is molded by resin having a light absorption band in wavelengths other than a peak wavelength of rays of light emitted by the LED chip, and the resin constitutes the convex lens.

In the LED lamp of the present embodiment, the resin constituting the convex lens has a light absorption band in the wavelengths other than the wavelength peak of rays of light emitted by the LED chip. This makes it possible to attenuate rays of light of unnecessary wavelengths and to increase display quality.

In one embodiment, the at least one LED chip is mounted on a black surface-treated lead frame.

This makes it possible to restrain the outside rays of light incident from the outside upon the convex lens from being reflected by the lead frame, and ensures prevention of misrecognition of an unlit diode lamp as being lit.

In one embodiment, the LED lamp further includes a reflection cup surrounding at least a part of a periphery of the LED chip, and an inner peripheral surface of the reflection cup is black surface-treated.

The black surface treated inner peripheral surface of the reflection cup restrains the outside rays of light entering the convex lens from being reflected to thereby restrain the outside rays of light from exiting from the convex lens to the outside. This ensures prevention of misrecognition of an unlit diode lamp as being lit.

In one embodiment, black-colored resin is mounted on a lead frame on which the LED chip is mounted, the black-colored resin being positioned behind the LED chip.

This black-colored resin forms a back surface of the LED chip, so that a contrast is improved.

Also, in one embodiment, an LED display unit has the above-described LED lamp. The LED display unit is capable of preventing misrecognition due to incident rays of light from the outside, without causing uneven display.

In one embodiment, at least one of the above two curved surfaces of the convex lens comprises a plurality of curved surfaces different in shape.

Therefore, it becomes possible to regulate the direction of rays of light outgoing from the curved surfaces of the convex lens by making each curved surface refract emissions from the LED chip with different powers.

In one embodiment, the plurality of curved surfaces include a curved surface on one side and a curved surface on the other side of a plane that is orthogonal to the extension of the light emitting surface of the LED chip and that does not intersect with the LED chip.

The LED lamp of the present embodiment is capable of preventing outgoing rays of light from an LED chip from concentrating upon the plane going through the light emitting surface, by which generation of an irregular light emitting peak at the front is prevented. This enables prevention of uneven display to thereby increase the display quality.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Figure 1:
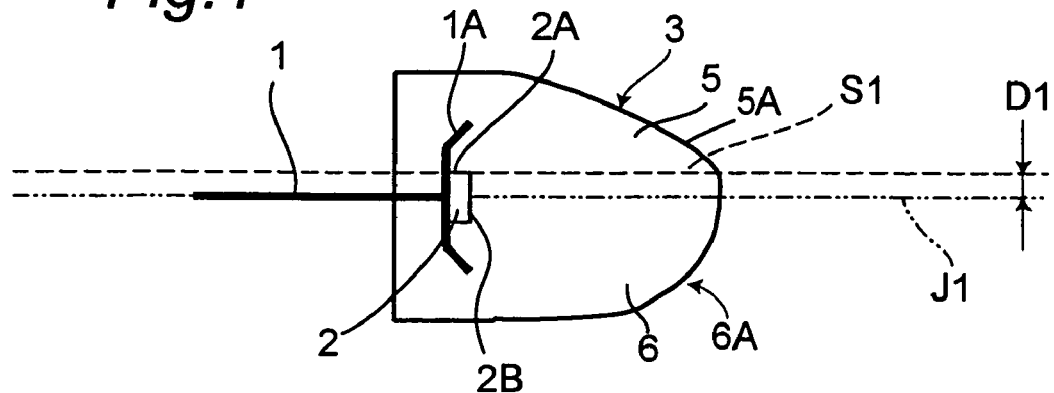
FIG. 1 is a side view of an LED lamp in a first embodiment of the present invention.

Below, a detailed description will be given of an embodiment of the present invention with reference to the drawings.

Note that while the same reference numerals may be used across different drawings, the parts referred to by the same numerals in different drawings are the same parts as described below in the detailed description.

First Embodiment

FIG. 1 shows an LED lamp in a first embodiment of the present invention seen from the side. In the first embodiment, an LED chip 2 is mounted on a cup-shaped mounting portion 1A of a lead frame 1. The LED chip 2 and the mounting portion 1A are embedded in a convex lens 3 made of resin. The resin convex lens 3 forms a convex lens protruding in the emission direction of rays of light from the LED chip 2, and has an upper portion 5 including an upper curved surface 5A exemplifying a curved surface on one side and a lower portion 6 including a lower curved surface 6A exemplifying a curved surface on the other side. In operation, the LED lamp uses a direction perpendicular to a light emitting surface 2B of the LED chip 2 as a frontward direction and the direction parallel to the light emitting surface 2B as an upward/downward direction. In use, the upper portion 5 is located on the upper side while the lower portion 6 is located on the lower side.

An interface plane S1 between the upper portion 5 and lower portion 6 is a plane that is orthogonal to an extension of the light emitting surface 2B of the LED chip 2 and that extends off the center of the light emitting surface 2B and is located higher by a distance D1 than an exit optical axis J1 of the LED chip 2. The interface plane S1 is located above an extended surface of an upper end surface 2A of the LED chip 2. Also, in the resin convex lens 3, an angle between the upper curved surface 5A of the upper portion 5 and the interface plane S1 is smaller than an angle between the lower curved surface 6A of the lower portion 6 and the interface plane S1. More particularly, the upper curved surface 5A, which is different in shape from the lower curved surface 6A, is shaped to refract rays of light emitted by the LED chip 2 more strongly than the lower curved surface 6A does. In other words, the convex lens 3 has vertically asymmetric lens curvatures.

Figure 2:
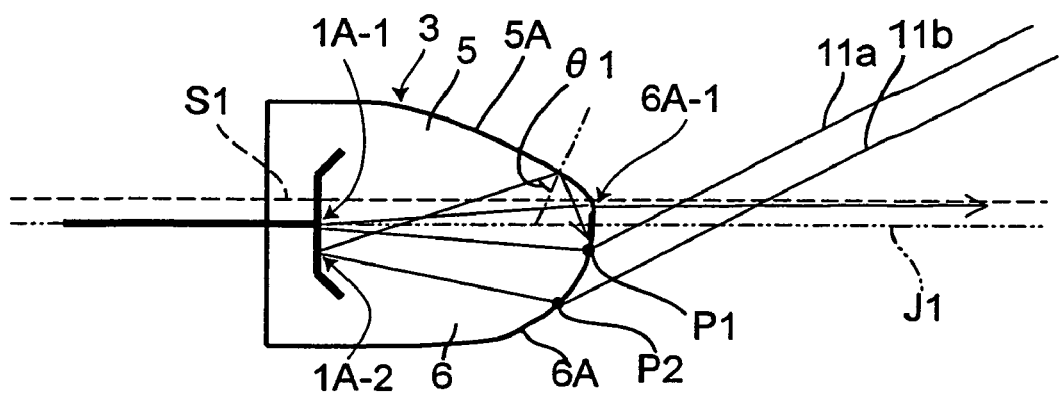
FIG. 2 is an explanatory view showing outside rays of light being refracted and reflected in the first embodiment.

FIGS. 2 shows that rays of sunlight (e.g., afternoon light) 11a, 11b of evening and early morning time having shallow irradiation angles relative to the resin convex lens 3 in this first embodiment enter the lower curved surface 6A of the lower portion 6 of the resin convex lens 3 at respective incident points P1, P2. It is noted that the LED chip 2 is omitted from FIG. 2. In this case, the ray of sunlight 11a is refracted by the lower curved surface 6A of the lower portion 6 of the resin convex lens 3 at the incident point P1, and reaches a central portion 1A-1 of the mounting portion 1A. The central portion 1A-1 of the mounting portion 1A is a portion at which the exit optical axis J1, which is a center in the upward/downward direction of the LED chip 2, meets the mounting portion 1A. The ray of sunlight 11a incident upon the central portion 1A-1 of the mounting portion 1A is reflected by the central portion 1A-1, and exits in approximately parallel to the exit optical axis J1 from an upper end portion 6A-1 of the lower curved surface 6A in the lower portion 6 of the resin convex lens 3. The upper end portion 6A-1 is closer to the interface plane S1 than the exit optical axis J1 is. In other words, the upper end portion 6A-1 is positioned above the exit optical axis J1.

The ray of sunlight 11b incident upon the incident point P2 of the lower curved surface 6A, which is located below the incident point P1 for the ray of sunlight 11a, is refracted by the lower curved surface 6A and comes incident upon a portion 1A-2 that is located lower than the central portion 1A-1 of the mounting portion 1A of the lead frame 1. An incident angle of the ray of sunlight 11b upon the portion 1A-2 is larger than an incident angle of the ray of sunlight 11a upon the central portion 1A-1. This is because the incident angle of the ray of sunlight 11b upon the lower curved surface 6A is larger than the incident angle of the ray of sunlight 11a upon the lower curved surface 6A, as a consequence of which the ray of sunlight 11b is refracted on the lower curved surface 6A more greatly than the ray of sunlight 11a is.

Accordingly, the ray of sunlight 11b is reflected on the portion 1A-2 of the mounting portion 1A at an angle larger than that of the ray of sunlight 11a. Consequently, the ray of sunlight 11b comes incident upon the upper curved surface 5A of the upper portion 5. Since an incident angle θ1 of the ray of sunlight 11b upon the upper curved surface 5A exceeds a critical angle θcr, the ray of sunlight 11b is totally reflected by the upper curved surface 5A and cannot exit to the outside from the upper curved surface 5A. Given that a refraction index of outside air is m1 and a refraction index of the resin constituting the resin convex lens 3 is m2, the critical angle θcr is calculated by the formula (1) below. In the first embodiment, for example, the critical angle θcr is 41°.

$$\theta cr = \sin^{-1}(m1/m2) \quad (1)$$

In the first embodiment, the upper curved surface 5A of the upper portion 5 is a curved surface that refracts rays of light emitted by the LED chip 2 larger than the lower curved surface 6A of the lower portion 6 does. Consequently, as is the case with the above-mentioned ray of sunlight 11b, some outside rays of light that come incident from the outside upon the lower curved surface 6A of the resin convex lens 3 and are reflected in the vicinity of the LED chip 2 are totally reflected by the upper curved surface 5A as described above and therefore do not exit from the resin convex lens 3. Other outside rays of light are refracted by the upper curved surface 5A so as to be directed downward. Therefore, according to the LED chip 2 having the resin convex lens 3, it becomes possible to prevent the misrecognition that an unlit LED lamp is lit, due to incident rays of light from the outside such as afternoon light.

Also in the first embodiment, the interface plane S1 between the upper portion 5 and the lower portion 6 of the resin convex lens 3 is located above the exit optical axis J1 of the LED chip 2, which makes it possible to prevent outgoing rays of light from the LED chip 2 from concentrating upon the interface plane S1 to thereby prevent generation of an irregular light emitting peak on the front side. Therefore, it becomes possible to avoid a phenomenon of abrupt decline of luminous intensity only with slight displacement of a view point from the front.

In the first embodiment, therefore, misrecognition due to incident rays of light from the outside such as reflected rays of light can be prevented without causing uneven display.

Second Embodiment

Figure 3:
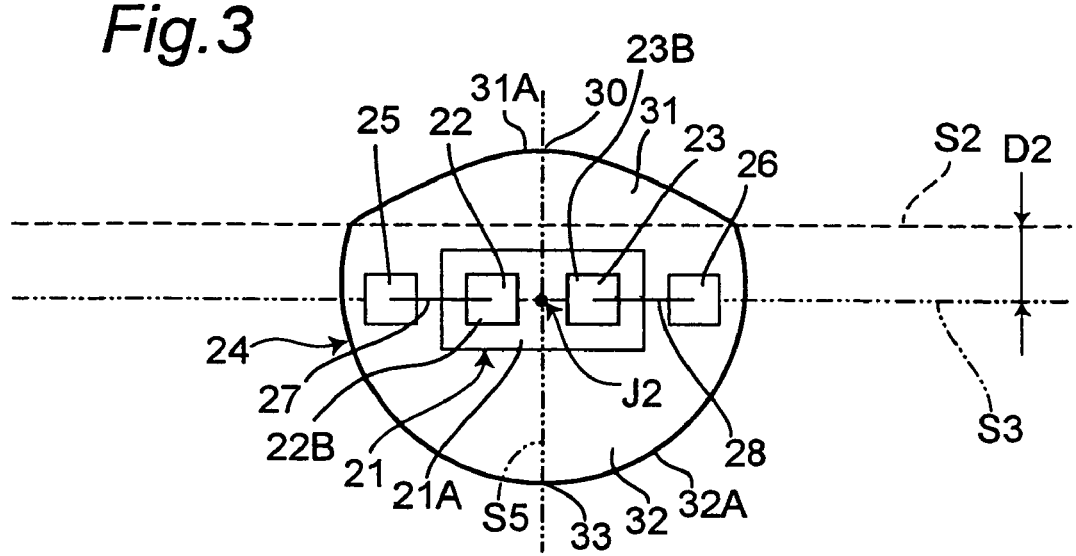
FIG. 3 is a front view of an LED lamp in a second embodiment of the present invention.

Next, FIG. 3 shows an LED lamp in a second embodiment of the present invention seen from the front side. In the second embodiment, two LED chips 22, 23 are mounted on a mounting portion 21A of a lead frame 21. These two LED chips 22, 23 are connected to respective electrode leads 25, 26 on both sides of the lead frame 21 through connection wires 27, 28.

The mounting portion 21A, the two LED chips 22, 23, and the electrode leads 25, 26 are embedded in a convex lens 24 made of resin. The convex lens 24 is convex toward the light emitting direction of the two LED chips 22, 23. The convex lens 24 is composed of an upper portion 31 and a lower portion 32 which abut on each other in an interface plane S2.

The interface plane S2 is a plane that is orthogonal to an extension of light emitting surfaces 22B, 23B of the LED chips 22, 23 and does not pass the LED chips 22, 23. In operation, the LED lamp uses the direction perpendicular to the light emitting surfaces 22B, 23B of the LED chips 22, 23 as a frontward direction and the direction parallel to the light emitting surface 22B as a vertical, or upward/downward direction. In use, the upper portion 31 is located on the upper side while the lower portion 32 is located on the lower side. The upper portion 31 has an upper curved surface 31A as a surface on one side and the lower portion 32 has a lower curved surface 32A as a surface on the other side. The interface plane S2 is parallel to an optical axis plane S3 containing exit optical axes that are vertical centers of the respective LED chips 22, 23, and the optical axis plane S3 is away from the interface plane S2 by a distance D2. As shown in FIG. 3, the interface plane S2 is positioned above the LED chips 22, 23 on the mounting portion 21A. The LED chips 22, 23 are arrayed in a lateral direction parallel to the interface plane S2.

The upper portion 31 of the convex lens 24 includes a maximum thickness portion 30 in which a vertical thickness of the upper portion 31 is maximal, on an orthogonal plane S5. The orthogonal plane S5 extends through a central axis J2 between the LED chips 22 and 23 on the optical axis plane S3 and is also orthogonal to the optical axis plane S3. The lower portion 32 of the convex lens 24 also includes a maximum thickness portion 33 in which a vertical thickness of the lower portion 33 is maximal, on the orthogonal plane S5.

The convex lens 24 is structured such that the upper curved surface 31A of the upper portion 31 is a curved surface that refracts outgoing rays of light from the LED chips 22, 23 larger than the lower curved surface 32A of the lower portion 32 does, and makes the rays of the light exit from the convex lens 24. According to the second embodiment, therefore, during operation, as with the first embodiment, it becomes possible to prevent the misrecognition of an unlit LED chip as being lit, due to incident rays of light from the outside such as afternoon light. Further, the interface plane S2 between the upper portion 31 and the lower portion 32 of the convex lens 24 is positioned higher than the optical axis plane S3 by a distance D2 and positioned above the LED chips 22, 23. According to the second embodiment, therefore, it becomes possible to prevent outgoing rays of light from the LED chips 22, 23 from being concentrated upon the interface plane S2 so as to prevent generation of an irregular light emitting peak at the front. This makes it possible to avoid a phenomenon of rapid decline of luminous intensity only with slight displacement of a view point from the front, or head-on side. Therefore in the second embodiment, misrecognition due to incident rays of light from the outside can be prevented without causing uneven display.

Further in the second embodiment, for example, the LED chip 22 is set to be a red-color LED and the LED chip 23 is set to be a green-color LED so as to implement a multicolor-lighting LED lamp. It should be understood that a lighting color combination of the LED chips 22 and 23 is not limited to the combination of red-color and green-color, and a combination of red-color and blue-color as well as a combination of yellow-color and green-color are also applicable. Giving the same color to the two LED chips 22, 23 enables increase of luminance. Although there are provided two LED chips in the second embodiment, there may be provided more than two LED chips.

Third Embodiment

Figure 4:
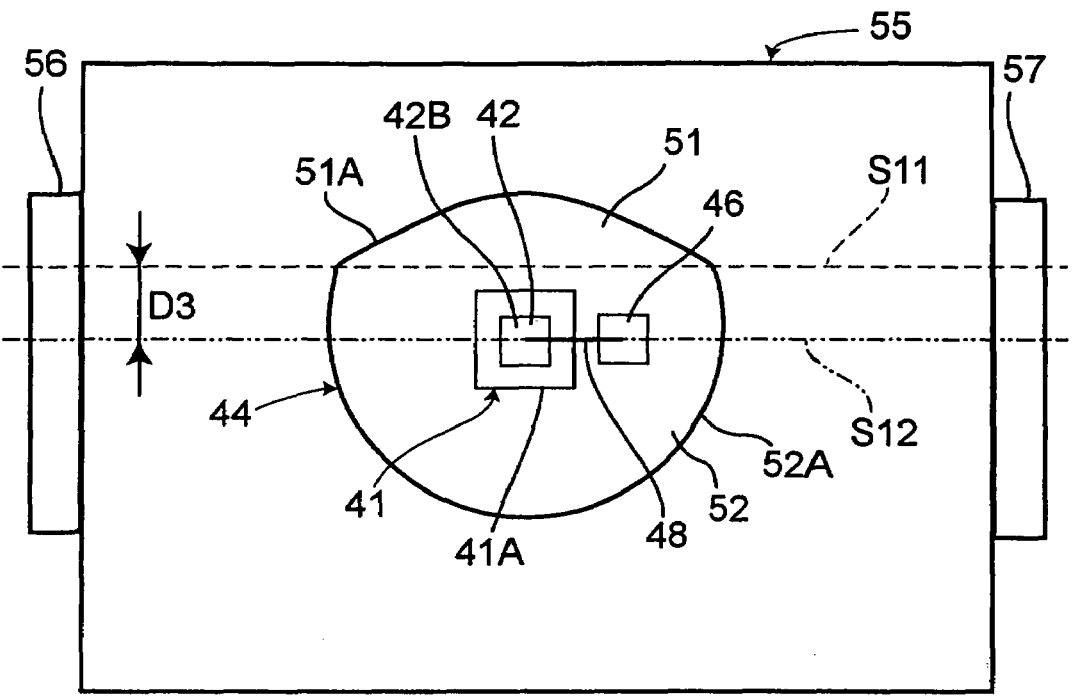
FIG. 4 is a front view of an LED lamp in a third embodiment of the present invention.

Next, FIG. 4 shows an LED lamp in a third embodiment of the present invention seen from the front side. In the third embodiment, an LED chip 42 is mounted on a mounting surface 41A of a lead frame 41, and the LED chip 42 is connected to an electrode lead 46 through a connection wire 48.

The lead frame 41, the LED chip 42, and the electrode lead 46 are embedded in a convex lens 44 made of resin. The convex lens 44 is convex toward the light emitting direction of the LED chip 42 (i.e., a direction perpendicular to the drawing sheet). The convex lens 44 is mounted on a body 55 made of resin. On both sides of the body 55, there are disposed connection terminals 56, 57 for connection to a printed wiring board (unshown). The connection terminal 56 is electrically connected to the lead frame 41 while the connection terminal 57 is electrically connected to the electrode lead 46.

The LED lamp, during operation, uses the direction perpendicular to a light emitting surface 42B of the LED chip 42 as a frontward direction and the direction parallel to the light emitting surface 42B as a vertical, or upward/downward direction. The convex lens 44 is composed of an upper portion 51 and a lower portion 52 in the above-stated upward/downward direction, and the upper portion 51 and the lower portion 52 abut on each other in an interface plane S11. The interface plane S11 is a plane that is orthogonal to an extension of the light emitting surface 42B of the LED chip 42 and does not intersect with the LED chip 42.

The upper portion 51 has an upper curved surface 51A as the one-side surface and the lower portion 52 has a lower curved surface 52A as the other-side surface. An optical axis plane S12 going through a vertical center of the light emitting surface of the LED chip 42 is parallel to the interface plane S11, and the optical axis plane S12 is away from the interface plane S11 by a distance D3.

The upper curved surface 51A of the upper portion 51 is a curved surface that refracts outgoing rays of light from the LED chip 42 more than the lower curved surface 52A of the lower portion 52 does.

Accordingly, a first angle is calculated by extracting an incident angle at which a ray of emitted light from the LED chip 42 impinges upon the upper curved surface 51A from an outgoing angle at which an emitted ray of light exits from the upper curved surface 51A, and a second angle is calculated by extracting an incident angle at which a ray of emitted light from the LED chip 42 impinges upon the lower curved surface 52A from an outgoing angle at which an emitted ray of light exits from the lower curved surface 52A, then the first angle is larger than the second angle.

According to the third embodiment, therefore, as with the first embodiment, during operation, it becomes possible to prevent the misrecognition of an unlit LED chip 42 as being lit due to incident rays of light from the outside such as afternoon light. Also, the interface plane S11 between the upper portion 51 and the lower portion 52 of the convex lens 44 is located higher than the optical axis plane S12 by the distance D3, and is located above the LED chip 42. According to the third embodiment, therefore, it becomes possible to prevent outgoing rays of light from the LED chip 42 from being concentrated upon the interface plane S11 so as to prevent generation of an irregular light emitting peak on the front side of the chip. This makes it possible to avoid a phenomenon of rapid decline of luminous intensity only with slight displacement of a view point from the front side of the chip. Therefore in the third embodiment, misrecognition due to incident rays of light from the outside such as sunlight may be prevented without causing uneven display.

It is noted that in the third embodiment, the resin convex lens 44 with the LED chip 42 embedded therein is mounted on the upper surface of the resin body 55 to form a surface-mounted LED lamp. However, the present invention is also applicable to LED lamps of a type that incorporates the convex lens 44 in the resin body 55, and to a type that the resin lens 44 pierces the upper surface of the body 55.

Fourth Embodiment

Figure 5:
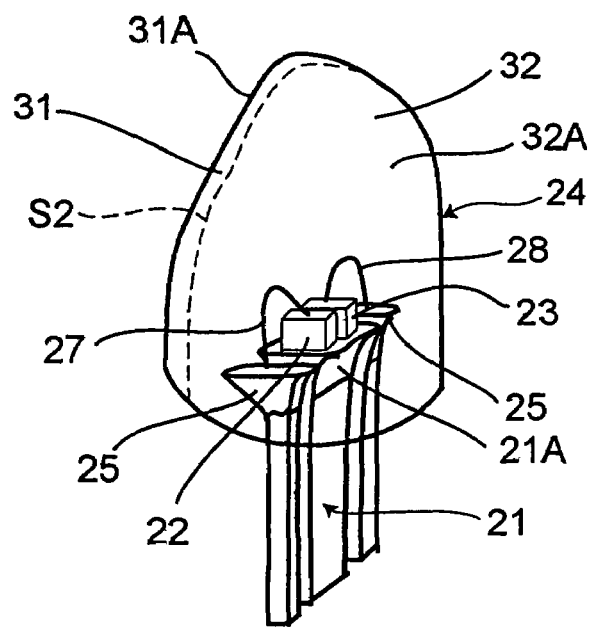
FIG. 5 is a perspective view of an LED lamp in a fourth embodiment of the present invention.

Next, FIG. 5 shows a fourth embodiment. In the fourth embodiment, the convex lens 24 made of resin in the above-described second embodiment is replaced with a convex lens made of epoxy resin which is mixed with a pigment that transmits rays of light having specified wavelengths (e.g., a wavelength corresponding to a green-color and a wavelength corresponding to a red-color) and attenuates rays of light having wavelengths other than the specified wavelengths. In this case, if, for example, the LED chip 22 is designed to emit red-color light, and the LED chip 23 is designed to emit green-color light, it becomes possible to attenuate practically unnecessary emitted light, thereby enabling further improvement of display quality.

Alternatively, the epoxy resin that forms the convex lens 24 may be mixed with a pigment having a light absorption band in the wavelengths other than the wavelength corresponding to green-color and the wavelength corresponding to red-color. In this case, unnecessary rays of light other than green-color and red-color lights are absorbed and attenuated by the convex lens, which increases display quality. It is noted that the materials that constitute the convex lens 24 may be resin other than the epoxy resin. If the pigment cannot be mixed in the resin, the pigment may be applied to the surface of the convex lens 24. Further, it is also possible to cover the surface of the convex lens 24 with a cover with the pigment mixed therein.

Fifth Embodiment

Figure 6:
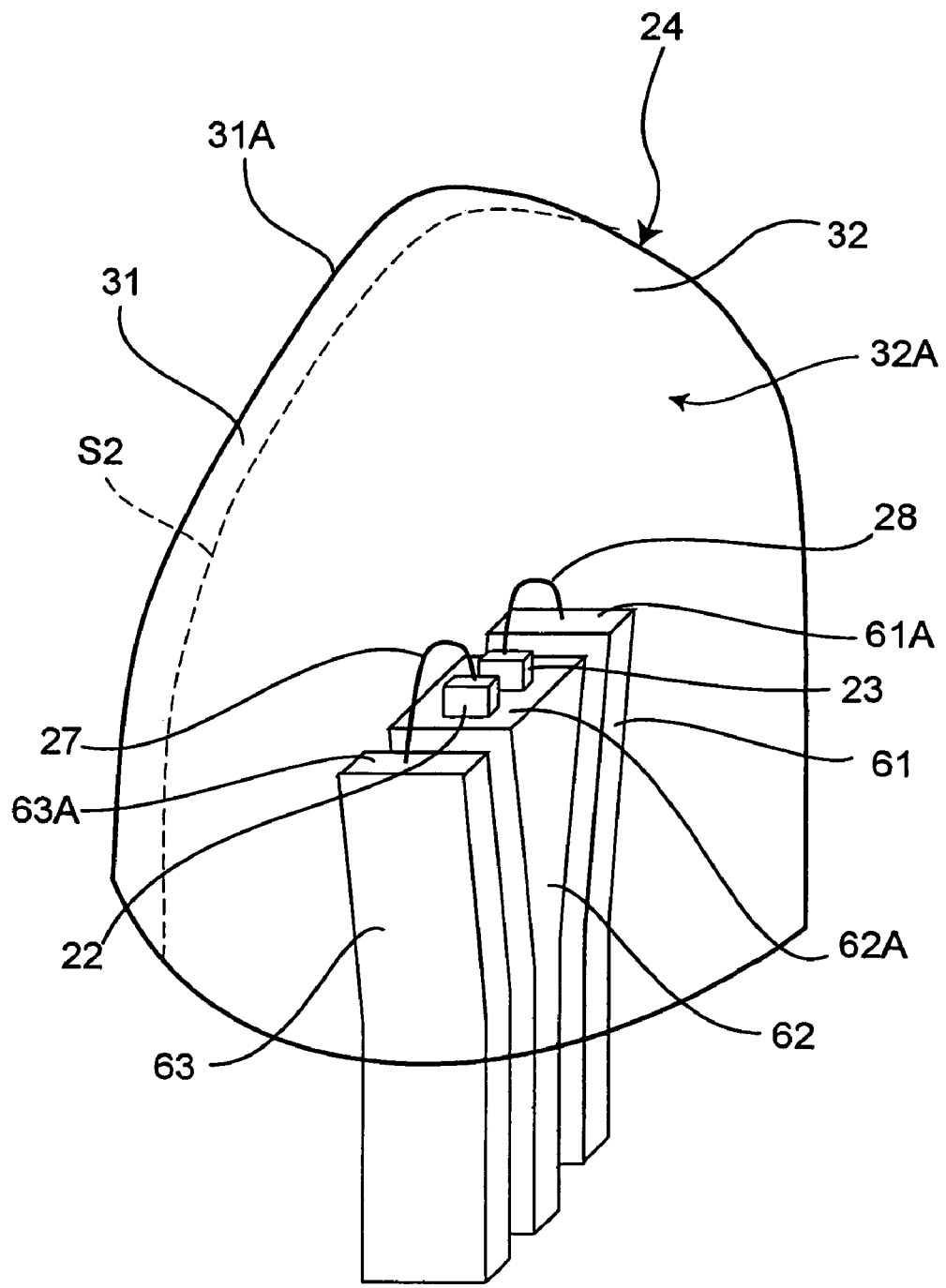
FIG. 6 is a perspective view of an LED lamp in a fifth embodiment of the present invention.

Next, a fifth embodiment is shown in FIG. 6. The fifth embodiment is different from the above-described second embodiment only in that instead of the lead frame 21, and the electrode leads 25, 26 of the second embodiment in FIG. 3, a lead frame 62 and electrode leads 63, 61 are provided.

In the fifth embodiment, black surface treatment is applied to a mounting surface 62A of the lead frame 62 so as to make light reflectance of the mounting surface 62A 80% or less. The black surface treatment is also applied to surfaces 63A, 61A of the electrode leads 63, 61 so as to make light reflectance of the surfaces 63A, 61A 80% or less. LED chips 22, 23 are mounted on the mounting surface 62A, and the LED chip 22 is connected to the surface 63A of the electrode lead 63 through a connection wire 27. The LED chip 23 is connected to the surface 61A of the electrode lead 61 through a connection wire 28.

In the fifth embodiment, light reflectance of the mounting surface 62A of the lead frame 62 is set to 80% or less, and light reflectance of the surfaces 63A, 61A of the electrode leads 63, 61 is set to 80% or less, which makes it possible to restrain outside rays of light having entered the convex lens 24 from reflecting on the mounting surface 62A and the surfaces 63A, 61A. Accordingly, it becomes possible to restrain outside rays of light entering the convex lens 24 from exiting from the convex lens 24, and to ensure prevention of misrecognition of an unlit diode lamp as being lit. As described above, in the fifth embodiment, black surface treatment is applied to set light reflectance of the mounting surface 62A of the lead frame 62 and the surfaces 63A, 61A of the electrode leads 63, 61 to be 80% or less. This is because reflectance of over 80% provides an insufficient reflection inhibition effect.

Sixth Embodiment

Figure 7:
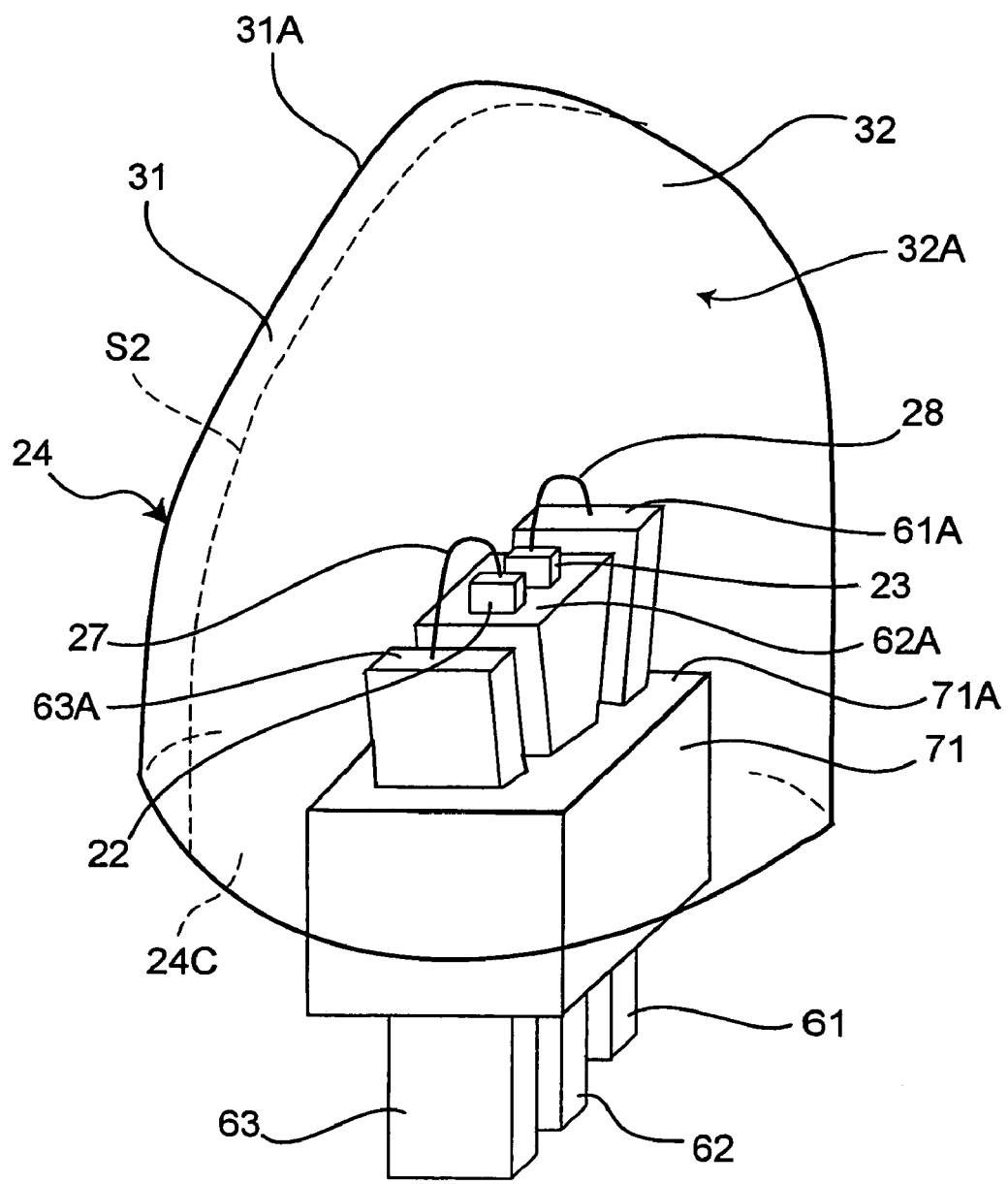
FIG. 7 is a perspective view of an LED lamp in a sixth embodiment of the present invention.

Next, FIG. 7 shows an LED lamp in a sixth embodiment of the present invention. The sixth embodiment is different from the above-described fifth embodiment only in the point that in a position retreated by a specified distance from the surfaces 62A, 63A and 61A of the lead frame 62 and of the electrode leads 63, 61 in the fifth embodiment of FIG. 6 in a direction opposite from the light emitting direction, there is provided a black-color resin piece 71 that extends from the inside of the convex lens 24 beyond its bottom surface 24C to the outside.

A neck portion 62A of the lead frame 62, a bending portion 63A of the electrode lead 63, and a bending portion 61A of the electrode lead 61 are embedded in the black-color resin piece 71 such that those portions are surrounded by the black-color resin piece 71. The black-color resin piece 71 as a whole has an approximately cubic shape.

In the sixth embodiment, a black-color front surface 71A of the black-color resin piece 71 defines back surfaces opposite to the mounting surface 62A of the lead frame 62, the surface 63A of the electrode lead 63, and the surface 61A of the electrode lead 61. Therefore in the sixth embodiment, a contrast can be improved.

Seventh Embodiment

Figure 8:
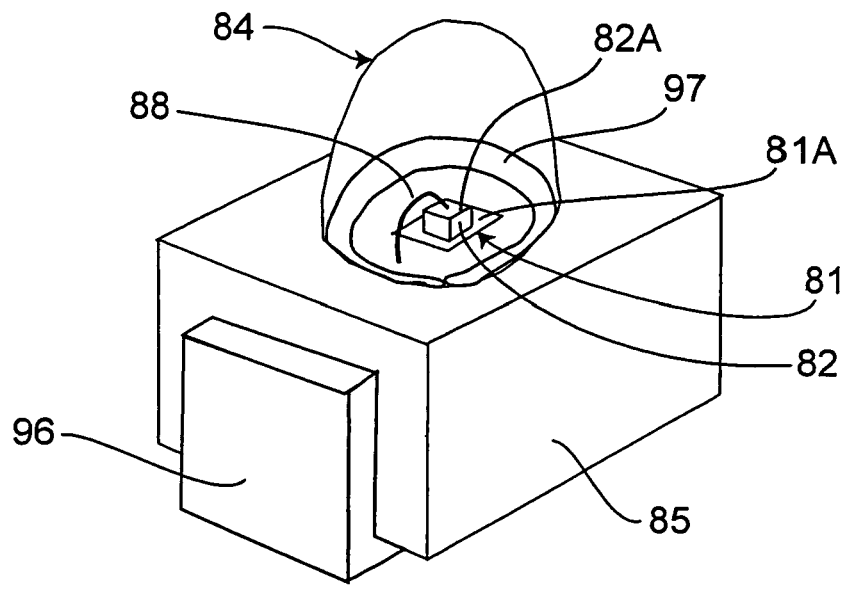
FIG. 8 is a perspective view of an LED lamp in a seventh embodiment of the present invention.

Next, FIG. 8 shows an LED lamp in a seventh embodiment of the present invention. In the seventh embodiment, an LED chip 82 is mounted on a mounting surface 81A of a lead frame 81, and the LED chip 82 is connected to an electrode lead 96 through a connection wire 88. The electrode lead 96 bends and extends from the bottom surface to a side surface of a resin body 85.

The LED chip 82 is embedded in a resin convex lens 84. The convex lens 84 is convex toward the light emitting direction of the LED chip 82. The LED lamp, during operation, uses the direction perpendicular to a light emitting surface 82A of the LED chip 82 as a frontward direction and the direction parallel to the light emitting surface as an upward/downward direction. As shown in the sectional view of FIG. 9, the convex lens 84 is composed of an upper portion 91 and a lower portion 92 in the above-stated upward/downward direction, and the upper portion 91 and the lower portion 92 abut on each other in an interface plane S51. The interface plane S51 is a plane that is orthogonal to an extension of the light emitting surface 82A of the LED chip 82 and does not intersect with the LED chip 82. The interface plane S51 is upwardly away from a central axis S52 of the LED chip 82 by a distance D5 and is upwardly away from the LED chip 82. Also, an upper curved surface 91A of the upper portion 91 of the convex lens 84 is shaped such that the upper curved surface 91A refracts outgoing rays of light from the LED chip 82 more strongly than a lower curved surface 92A of the lower portion 92 does. According to the seventh embodiment, therefore, as with the first to sixth embodiments, it becomes possible to prevent the misrecognition that an actually unlit LED chip 82 is lit, due to incident rays of light from the outside such as afternoon light. Also, the interface plane S51 between the upper portion 91 and the lower portion 92 of the convex lens 84 is located higher than the central axis S52 by the distance D5, and is located above the LED chip 82. According to the seventh embodiment, therefore, it becomes possible to prevent outgoing rays of light from the LED chip 82 from being concentrated upon the interface plane S51 so as to prevent generation of an irregular light emitting peak at the front.

Figure 9:
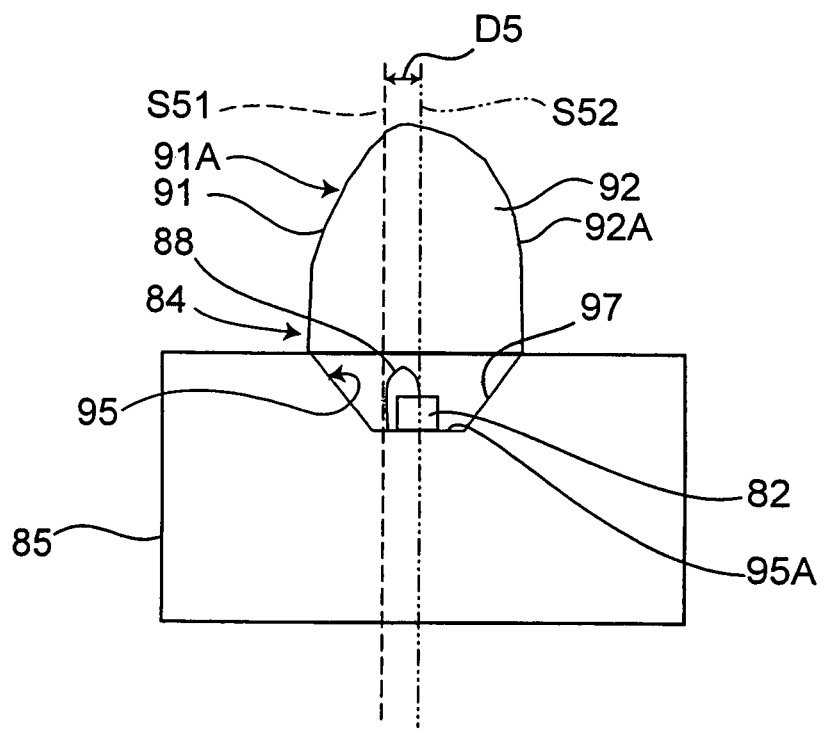
FIG. 9 is a cross sectional view of the LED lamp in the seventh embodiment.
Figure 10:
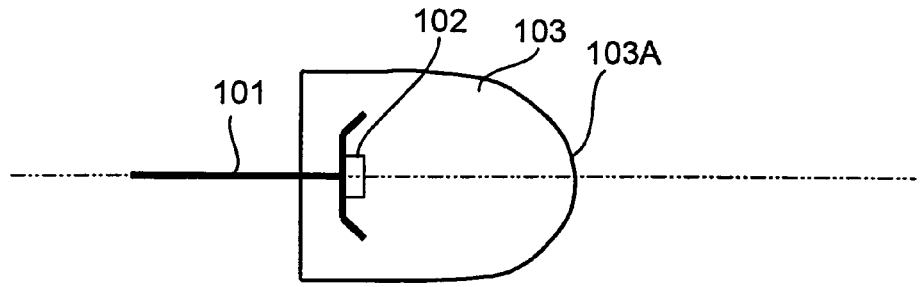
FIG. 10 is a side view of a conventional LED lamp.
Figure 11:
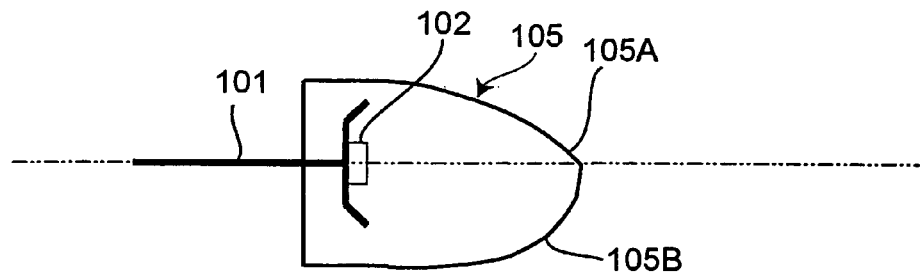
FIG. 11 is a side view of another conventional LED lamp.
Figure 12:
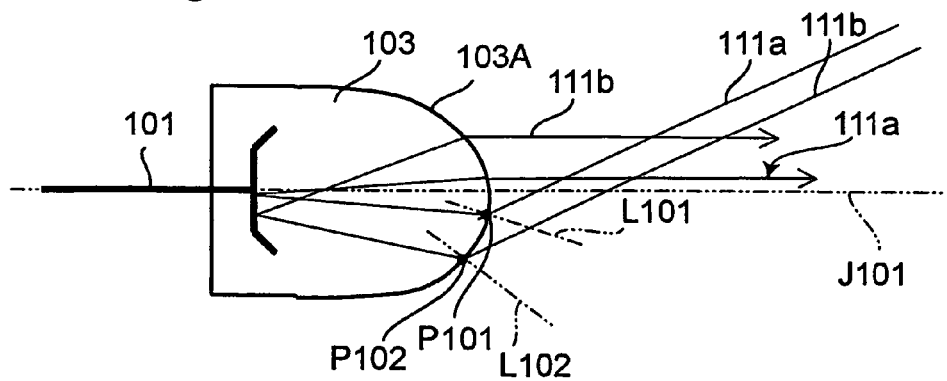
FIG. 12 is an explanatory view showing outside rays of light being refracted and reflected by the conventional LED lamp of FIG. 10.

Also in the seventh embodiment, as shown in FIG. 9, the LED chip 82 is disposed at a bottom 95A of a cone-shaped hollow 95 of the resin body 85. A peripheral wall surface 97 serving as a reflection cup of the hollow 95 is black surface-treated so as to set light reflectance to 80% or less. The peripheral wall surface 97 with reflectance of 80% or less is shaped such that a diameter thereof is increased toward the light emitting direction of the LED chip 82 so that the cone-shaped hollow is broadened toward the end. The black-colored peripheral wall surface 97 restrains outside rays of light having entered the convex lens 84 from being reflected and exiting from the convex lens 84 to the outside. This enables more reliable prevention of misrecognition of an unlit lamp as being lit. Also, in the seventh embodiment, the black surface treatment is applied to set reflectance of the peripheral wall surface 97 to 80% or less. This is because reflectance of over 80% does not provide a sufficient reflection inhibition effect.

The LED lamps as described in the first to the seventh embodiments may be arrayed in matrix form so as to enable implementation of an LED display unit for displaying information such as images, symbols, and letters. According to this LED display unit, it becomes possible to restrain uneven display, increase display quality, and restrain misrecognition due to outside rays of light.

Eight Embodiment

Figure 13:
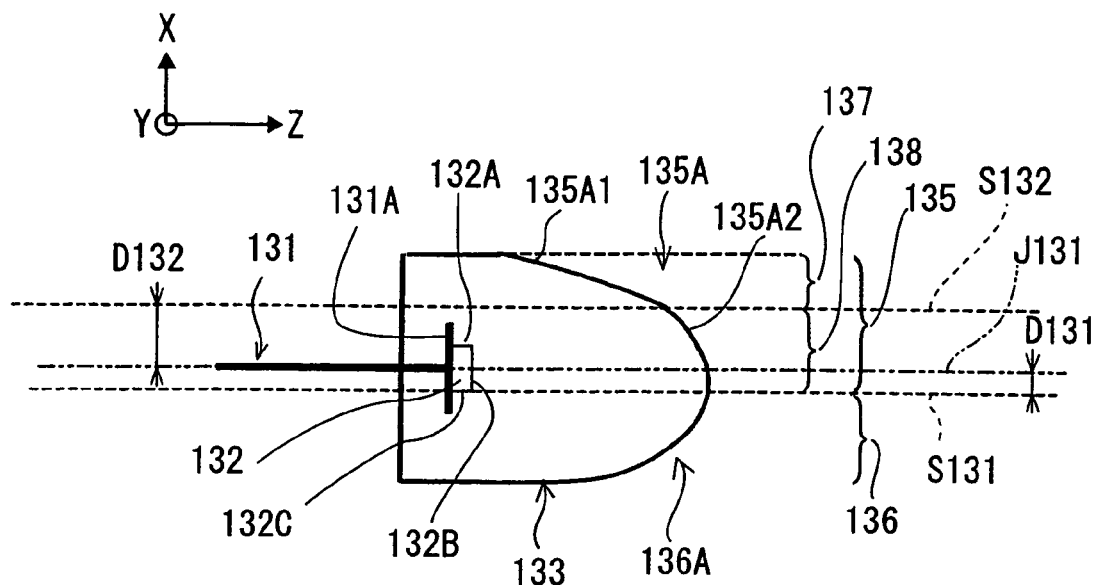
FIG. 13 is a side view showing an LED lamp in an eighth embodiment of the present invention.

FIG. 13 shows an LED lamp in an eighth embodiment of the present invention seen from a lateral side. In the eighth embodiment, an LED chip 132 is mounted on a plate-shaped mounting portion 131A of a lead frame 131. The LED chip 132 and the mounting portion 131A are embedded in a convex lens 133 made of resin. The resin convex lens 133 is convex in the emission direction of rays of light emitted from the LED chip 132. The convex lens 133 has an upper portion 135 and a lower portion 136. The lens surface of the convex lens 133 is composed of an upper curved surface 135A of the upper portion 135 and a lower curved surface 136A of the lower portion 136.

The upper curved surface 135A exemplifies a curved surface on one side while the lower curved surface 136A exemplifies a curved surface on the other side.

An interface plane S131, which is a joint surface between the upper portion 135 and the lower portion 136 of the convex lens 133, is orthogonal to an extended surface of a light emitting surface 132B of the LED chip 132, and extends off the center of the light emitting surface 132B and is located lower by a distance D131 than an exit optical axis J131 of the LED chip 132. The interface plane S131 is located below an extended surface of a lower end surface 132C of the LED chip 132.

The upper portion 135 of the resin convex lens 133 is composed of a first upper portion 137 and a second upper portion 138, and the first upper portion 137 has a first upper curved surface 135A1, while the second upper portion 138 has a second upper curved surface 135A2.

An interface plane S132 that is a joint surface between the first upper portion 137 and the second upper portion 138 locates higher by a distance D132 than an exit optical axis J131, and also above an extended surface of an upper end surface 132A of the LED chip 132.

The LED lamp, during operation, uses the direction perpendicular to a light emitting surface 132B of the LED chip 132 as a frontward direction and the direction parallel to the light emitting surface 132B as an upward/downward direction. During operation, the upper portion 135 locates on the upper side while the lower portion 136 locates on the lower side. More specifically, in FIG. 13, the direction of an arrow-headed X-axis denotes the upward direction and the direction of an arrow-headed Z-axis denotes an optical axis direction. Also, a Y-axis direction that is perpendicular to the upward direction and the optical axis direction is a lateral direction.

As shown in FIG. 13, the upper curved surface 135A of the upper portion 135 is shaped such that the upper curved surface 135A refracts outgoing rays of light from the LED chip 132 more than the lower curved surface 136A positioned axisymmetrically to the surface 135A about the exit optical axis J131. More specifically, the upper curved surface 135A of the upper portion 135 is in the shape of a curved surface where an incident angle of outgoing rays of light from the LED chip 132 is larger than that at the lower curved surface 136A positioned axisymmetrically about the exit optical axis J131.

Again, in the eighth embodiment, the upper curved surface 135A, which is different in shape from the lower curved surface 136A, is shaped to refract rays of light emitted by the LED chip 132 larger than the lower curved surface 136A does. In other words, the convex lens 133 has vertically asymmetric lens curvatures.

An outside ray of light that comes incident at a shallow angle (as typified by afternoon light) upon the lower curved surface 136A of the convex lens 133 is refracted and reaches an internal location where the LED chip 132 is mounted, and then the ray of light is reflected to reach the upper curved surface 135A. This outside ray of light is then steeply refracted by the upper curved surface 135A and emitted toward the lower side. If the outside ray of light comes incident upon the upper curved surface 135A at an incident angle beyond a critical angle, the outside ray of light is totally reflected by the upper curved surface 135A and does not exit from the convex lens 133. The upper curved surface 135A refracts the outgoing rays of light, which are emitted from the LED chip 132 and have an identical outgoing angle, more steeply than the lower curved surface 136A does.

Accordingly, in the present embodiment, if outside rays of light come incident, reflection of the outside rays of light toward the front side is avoidable, and therefore the misrecognition of an unlit diode lamp as being lit can be prevented.

Further, in the present embodiment, since the upper curved surface 135A and the lower curved surface 136A are disposed on the upper side and the lower side of the interface plane S131 extending off the center of the light emitting surface 132B, outgoing rays of light are prevented from the LED chip 132 from concentrating upon the plane extending through the center of the light emitting surface 132B, thereby enabling prevention of an irregular light emitting peak from being produced at the front. This makes it possible to avoid the phenomenon of rapid decline of luminous intensity only with slight displacement of a view point from the front, and to prevent misrecognition due to incident rays of light from the outside such as afternoon sunlight without, causing uneven display.

Figure 20:
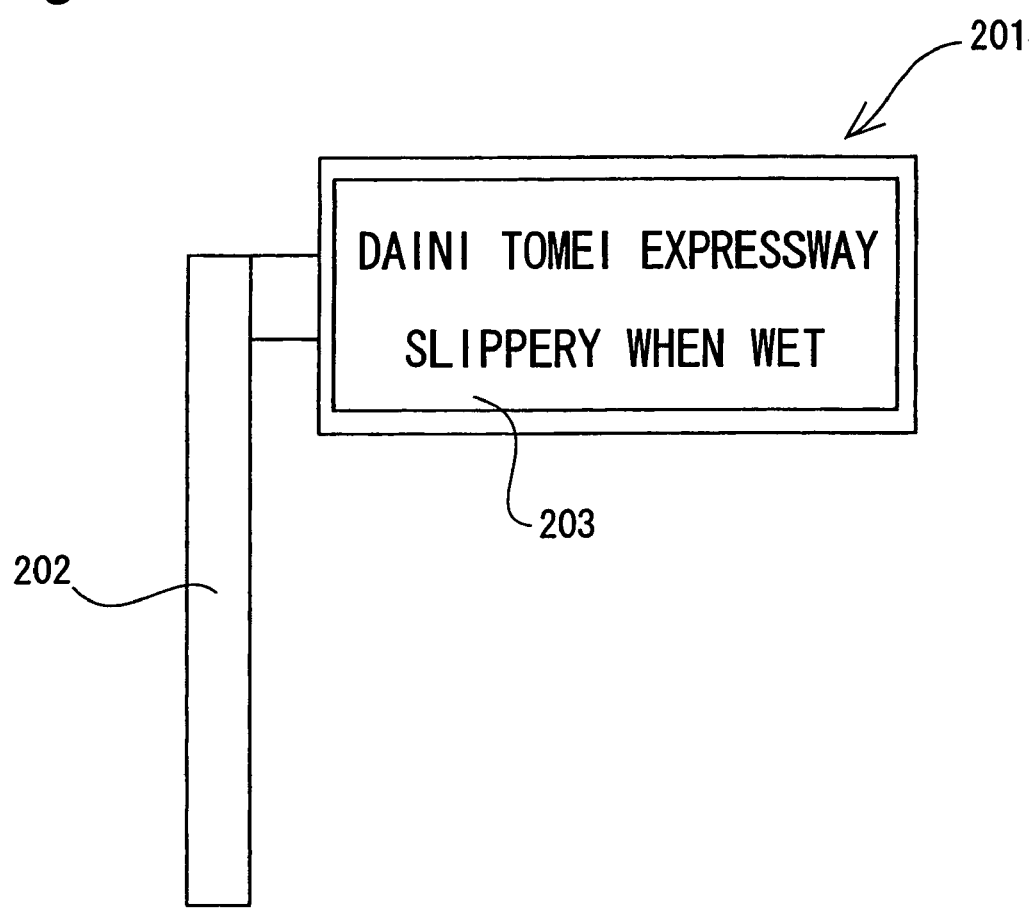
FIG. 20 is a view showing an embodiment of an LED display unit having the LED lamp of the present invention.

Also in the eighth embodiment, the interface plane S131 between the upper curved surface 135A and the lower curved surface 136A is positioned below the optical axis J131, so that outgoing rays of light are collected more in the downward direction, as compared to the case where the interface plane S131 is positioned on or above the optical axis J131. Therefore, the LED lamp in the eighth embodiment is suitable for use in display unit for displaying information from on high toward underneath viewers, such as, for example, an LED display unit 201 for displaying road information such as traffic information as shown in FIG. 20, which has a display surface 203 oriented in approximately a horizontal direction and supported by a pole 202 at the height of several meters above the ground. In such a case, a peak of the intensity distribution of outgoing rays of light from the convex lens 133 may be set to, for example, downward 3° where the lateral direction is 0°. More particularly, the upper portion 135 of the convex lens 133 of the LED lamp in the eighth embodiment is positioned on the upper side, and the lower portion 136 is positioned on the lower side. According to the LED display unit 201, it becomes possible to reduce reflection at the display surface 203 of sunlight to thereby prevent the misrecognition. It is noted that in the LED display unit 201, the convex lens 133 of the LED lamp may be rotated by a specified angle about the optical axis J131, depending on an incident angle of the sunlight upon the display surface 203 before being mounted on the display surface 203.

Further in the eighth embodiment, as shown in FIG. 13, the upper curved surface 135A of the upper portion 135 of the convex lens 133 has a maximum curvature on the interface plane S132 located higher by a distance D132 (e.g., 2.0 mm) than the optical axis J131. In the eighth embodiment, it becomes possible to collect outgoing rays of light from the LED chip 132 to some degree onto the interface plane S132 to thereby regulate distribution of light going in the upward direction.

Also, the first upper curved surface 135A1 of the upper curved surface 135A has a curvature smaller than that of the second upper curved surface 135A2, and is located above the second upper curved surface 135A2. In the upper curved surface 135A, the second upper curved surface 135A2 makes the transition to the first upper curved surface 135A1 at the interface plane S132 where the inclination of the upper curved surface 135A relative to a horizontal plane containing the Y axis and Z axis decreases abruptly. The presence of the first upper curved surface 135A1 enables increase of the luminous intensity distribution in the downward direction.

Next, more detailed description will be given of an example of the configuration of the lens surface of the convex lens 133 in the eighth embodiment.

The first upper curved surface 135A1 of the upper curved surface 135A constituting a lens surface is specified by the following formula (f1):

$$Z^2/(9.02)^2 + x^2/(3.015)^2 = 1 \tag{f1}$$

In the above formula (f1), a point (x1, z1) in the x-z coordinate plane, having an origin P0 at an intersecting point between the optical axis J131 and the light emitting surface 132B of the LED chip 132, is set as a center point P1 of an ellipse. Here, a point P1 (0, 0) is defined as the center P1 (x1, z1). In the formula (f1), x denotes an x-coordinate (in mm) from the center P1 (x1, z1), and z denotes a z-coordinate (in mm) from the center P1 (x1, z1).

The second upper curved surface 135A2 of the upper curved surface 135A constituting a lens surface is specified by the following formula (f2):

$$Z^2/(3.42)^2 + x^2/(3.065)^2 = 1 \tag{f2}$$

In the above formula (f2), a point (x2, z2) in the x-z coordinate plane, having the origin P0, is set as a center point P2 of an ellipse. Here, a point P2 (0, 5.52) is defined as the center P2 (x2, z2). In the formula (f2), x denotes an x-coordinate (in mm) from the center P2 (x2, z2), and z denotes a z-coordinate (in mm) from the center P2 (x2, z2).

The lower curved surface 136A constituting a lens surface is specified by the following formula (f3):

$$Z^2/(3.62)^2 + x^2/(3.065)^2 = 1 \tag{f3}$$

In the above formula (f3), a point (x3, z3) in the x-z coordinate plane, having the origin P0, is set as center P3 of an ellipse. Here, a point P3 (0, 5.32) is defined as the center P3 (x3, z3). In the formula (f3), x denotes an x-coordinate (in mm) from the center P3 (x3, z3), and z denotes a z-coordinate (in mm) from the center P3 (x3, z3).

In the specific example of the configuration of the lens surface in the above embodiment specified by the formulas (f1), (f2), and (f3), the distance D131 is 0.2 mm, and the distance D132 is 2.0 mm. More specifically, at the point 0.2 mm below the optical axis J131, the lower curved surface 136A meets the second upper curved surface 135A2. Also at the point 2.0 mm above the optical axis J131, the second upper curved surface 135A2 meets the first upper curved surface 135A1.

It is noted that the curvature shape of the first upper curved surface 135A1, the second upper curved surface 135A2, and the lower curved surface 136A on a horizontal plane (i.e., a plane parallel to the Y-Z plane) is of an ellipse of which a vertex is an intersection point with a vertical plane that goes through the origin P0, and which is specified by the following formula (f4):

$$Z^2/(3.62)^2 + y^2/(3.015)^2 = 1 \tag{f4}$$

In the above formula (f4), a unit of z-coordinate and y-coordinate is mm.

Further, the joints of the lens surface specified by the above formulas (f1) to (f4) are chamfered so as to eliminate sharp corners. In the specific example of the eighth embodiment, it becomes possible to decrease an influence of outside rays of light by, for example, 20%, resulting in an increased light emitting rate from the LED chip 132. Also, use of the first and second upper curved surfaces 135A1, 135A2 in combination makes it possible to regulate a distribution of outgoing rays of light from the upper portion 135 of the convex lens 133.

Ninth Embodiment

Figure 14:
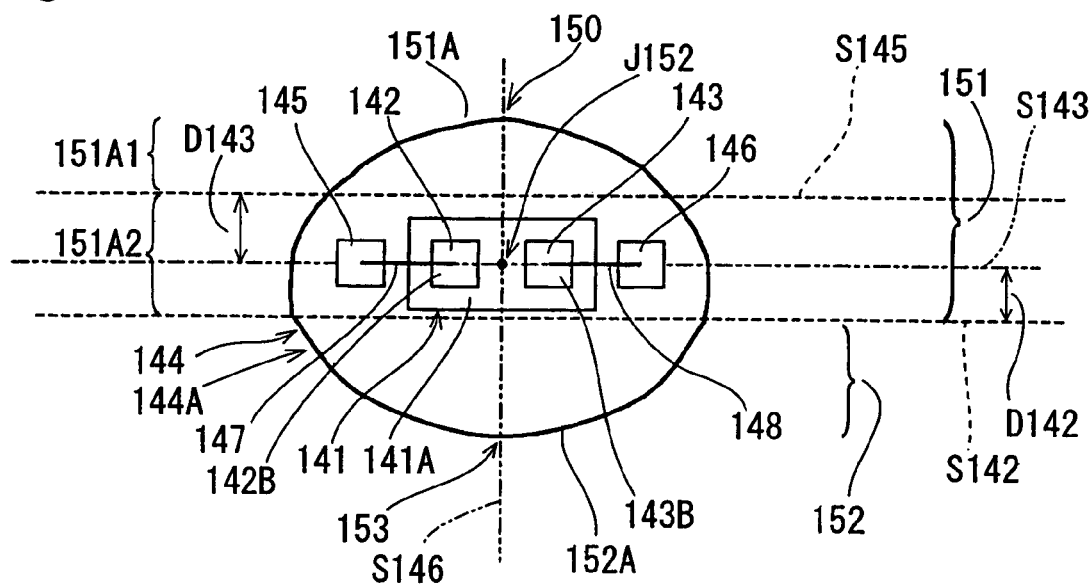
FIG. 14 is a front view of an LED lamp in a ninth embodiment of the present invention.

Next, FIG. 14 shows an LED lamp in a ninth embodiment of the present invention seen from the front side. In the ninth embodiment, two LED chips 142, 143 are mounted on a mounting portion 141A of a lead frame 141. These two LED chips 142, 143 are connected to respective electrode leads 145, 146 on both sides of the lead frame 141 through connection wires 147, 148.

The mounting portion 141A, the two LED chips 142, 143, and the electrode leads 145, 146 are embedded in a convex lens 144 made of resin. The convex lens 144 is convex toward the light emitting direction of the two LED chips 142, 143. The convex lens 144 is composed of an upper portion 151 and a lower portion 152 which abut on each other on an interface plane S142. The interface plane S142 is a plane that is orthogonal to extended surfaces of light emitting surfaces 142B, 143B of the LED chips 142, 143 and does not intersect with the LED chips 142, 143. The LED lamp, during operation, uses the direction perpendicular to the light emitting surfaces 142B, 143B of the LED chips 142, 143 as a frontward direction and the normal direction to the interface plane S142 as an upward/downward direction.

In operation, the upper portion 151 is located on the upper side of the interface plane S142 while the lower portion 152 is located on the lower side of the interface plane S142.

The upper portion 151 has an upper curved surface 151A as the one-side curved surface, and the lower portion 152 has a lower curved surface 152A as the other-side curved surface. The interface plane S142 is parallel to an optical axis plane S143, which goes through an exit optical axis that is the center of the upward/downward direction of the light emitting surfaces 142B, 143B of the two LED chips 142, 143, and which is orthogonal to the light emitting surfaces 142B, 143B. The optical axis plane S143 is away from the interface plane S142 by a distance D142. As shown in FIG. 14, the interface plane S142 is positioned below the LED chips 142, 143. The LED chips 142, 143 are arrayed in a lateral direction that is perpendicular to the optical axis direction and that is also perpendicular to the above-stated upward/downward direction.

The upper portion 151 of the convex lens 144 includes a maximum thickness portion 150 in which a vertical thickness of the upper portion 151 is maximal, on an orthogonal plane S146. The orthogonal plane S146 extends across a central axis J152 extends in an optical axis direction between the LED chips 142 and 143, and intersects with the optical axis plane S143. The lower portion 152 of the convex lens 144 also includes a maximum thickness portion 153 in which a vertical thickness of the lower portion 152 is maximal, on the orthogonal plane S146.

The upper curved surface 151A of the upper portion 151 and the lower curved surface 152A of the lower portion 152 form a lens surface 144A of the convex lens 144. The upper curved surface 151A of the lens surface 144A is a curved surface that refracts outgoing rays of light from the LED chips 142, 143 larger than the lower curved surface 152A does, and makes the rays of the light exit from the lens surface 144A. According to the ninth embodiment, therefore, as with the eighth embodiment, it becomes possible to prevent the misrecognition that an actually unlit LED chip is lit, due to incident rays of light from the outside such as afternoon light.

Further in the ninth embodiment, the upper curved surface 151A and the lower curved surface 152A are positioned on the upper side and the lower side relative to the interface plane S142 extending off the centers of the light emitting surfaces 142B, 143B. Therefore, it becomes possible to prevent outgoing rays of light from the LED chips 142, 143 from being concentrated upon the plane S143 that goes through the centers of the light emitting surfaces 142B, 143B so as to prevent generation of an irregular light emitting peak on the front side. This makes it possible to avoid the phenomenon of rapid decline of luminous intensity only with slight displacement of a view point from the front side, and to prevent the misrecognition due to incident rays of light from the outside, without causing uneven display.

Also in the ninth embodiment, the interface plane S142 between the upper curved surface 151A and the lower curved surface 152A is positioned below the optical axis plane S143, so that outgoing rays of light are collected in downward direction to more extent, compared with the case where the interface plane S142 is positioned above the optical axis plane S143. Therefore, the LED lamp in the eighth embodiment is suitable for use in display units for displaying information from on high toward underneath viewers, such as, for example, an LED display unit 201 for displaying road information such as traffic information as shown in FIG. 20, which has a display surface 203 oriented in approximately a horizontal direction and supported by a pole 202 at the height of several meters above the ground. In such a case, a peak of the intensity distribution of outgoing rays of light from the convex lens 144 may be set to, for example, downward 3° where the lateral direction is 0°.

Also in the ninth embodiment, the upper curved surface 151A of the upper portion 151 is composed of a first upper curved surface 151A1 and a second upper curved surface 151A2. The first upper curved surface 151A1 and the second upper curved surface 151A2 abut on each other on an interface plane S145. The first upper curved surface 151A1 is positioned higher than the second upper curved surface 151A2 relative to the interface plane S145. The interface plane S145 is parallel to the optical axis plane S143 and the interface plane S142. Also, the interface plane S145 is positioned higher than the optical axis plane S143 by a distance D143, and does not intersect with the light emitting surfaces 142B, 143B.

Further, in the ninth embodiment, the upper curved surface 151A of the upper portion 151 of the convex lens 144 has a maximum curvature at the interface plane S145 located higher by a distance D143 (e.g., 2.0 mm) than the optical axis plane S143. Consequently in the ninth embodiment, it becomes possible to collect outgoing rays of light from the LED chips 142, 143 to some degree onto the interface plane S145 to thereby regulate distribution of the upward light.

The first upper curved surface 151A1 of the upper curved surface 151A has a curvature smaller than that of the second upper curved surface 151A2, and is located above the second upper curved surface 151A2. In the upper curved surface 151A, the second upper curved surface 151A2 makes the transition to the first upper curved surface 151A1 at the interface plane S145 where the inclination of the upper curved surface 135A relative to the optical axis plane (a horizontal plane) S143 decreases abruptly. The presence of the first upper curved surface 151A1 enables increase of the luminous intensity distribution in the downward direction.

Further, in the ninth embodiment, for example, the LED chip 142 may be designed as a red-color LED and the LED chip 143 may be designed as a green-color LED so as to implement a multicolor-lighting LED lamp. It should be understood that a lighting color combination of the LED chips 142 and 143 is not limited to the combination of red-color and green-color, but a combination of red-color and blue-color and a combination of yellow-color and green-color are also applicable. Giving the same color to the two LED chips 142, 143 enables increase of luminance. Although there are provided two LED chips in the ninth embodiment, there may be provided more than two LED chips.

Tenth Embodiment

Figure 15:
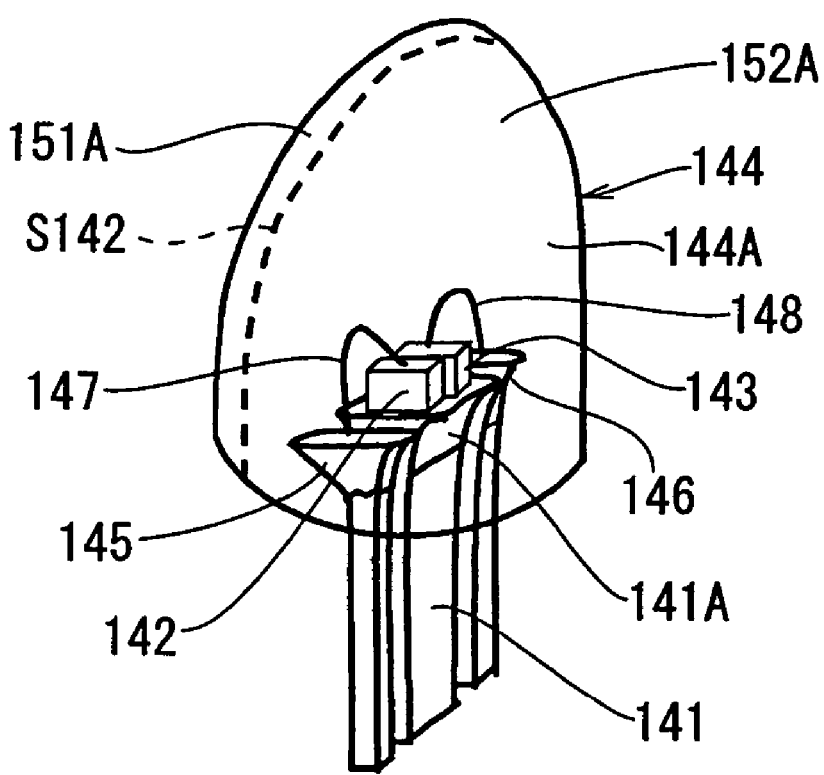
FIG. 15 is a perspective view of an LED lamp in a tenth embodiment of the present invention.

Next, FIG. 15 shows a tenth embodiment. In the tenth embodiment, the convex lens 144 made of resin in the above-described ninth embodiment is replaced with a convex lens made of epoxy resin which is mixed with a pigment that transmits rays of light having specified wavelengths (e.g., a wavelength corresponding to green-color and a wavelength corresponding to a red-color) and attenuates rays of light having wavelengths other than the specified wavelengths. In this case, if, for example, the LED chip 142 is designed to emit a red-color light, and the LED chip 143 is designed to emit a green-color light, it becomes possible to attenuate practically unnecessary emitted light, thereby enabling further increase of display quality, and also inhibiting re-reflection of rays of light entering the convex lens 144 from the outside.

Alternatively, the epoxy resin that forms the convex lens 144 may be mixed with a pigment having a light absorption band in the wavelengths other than the wavelength corresponding to green-color and the wavelength corresponding to red-color. In this case, unnecessary rays of light other than green-color and red-color lights are absorbed and attenuated by the convex lens, which increases display quality. It is noted that the materials of the convex lens 144 may be resin other than the epoxy resin. If the pigment cannot be mixed in the resin, the pigment may be applied to the surface of the convex lens 144. Further, it is also possible to cover the surface of the convex lens 144 with a cover with the pigment mixed therein.

Eleventh Embodiment

Figure 16:
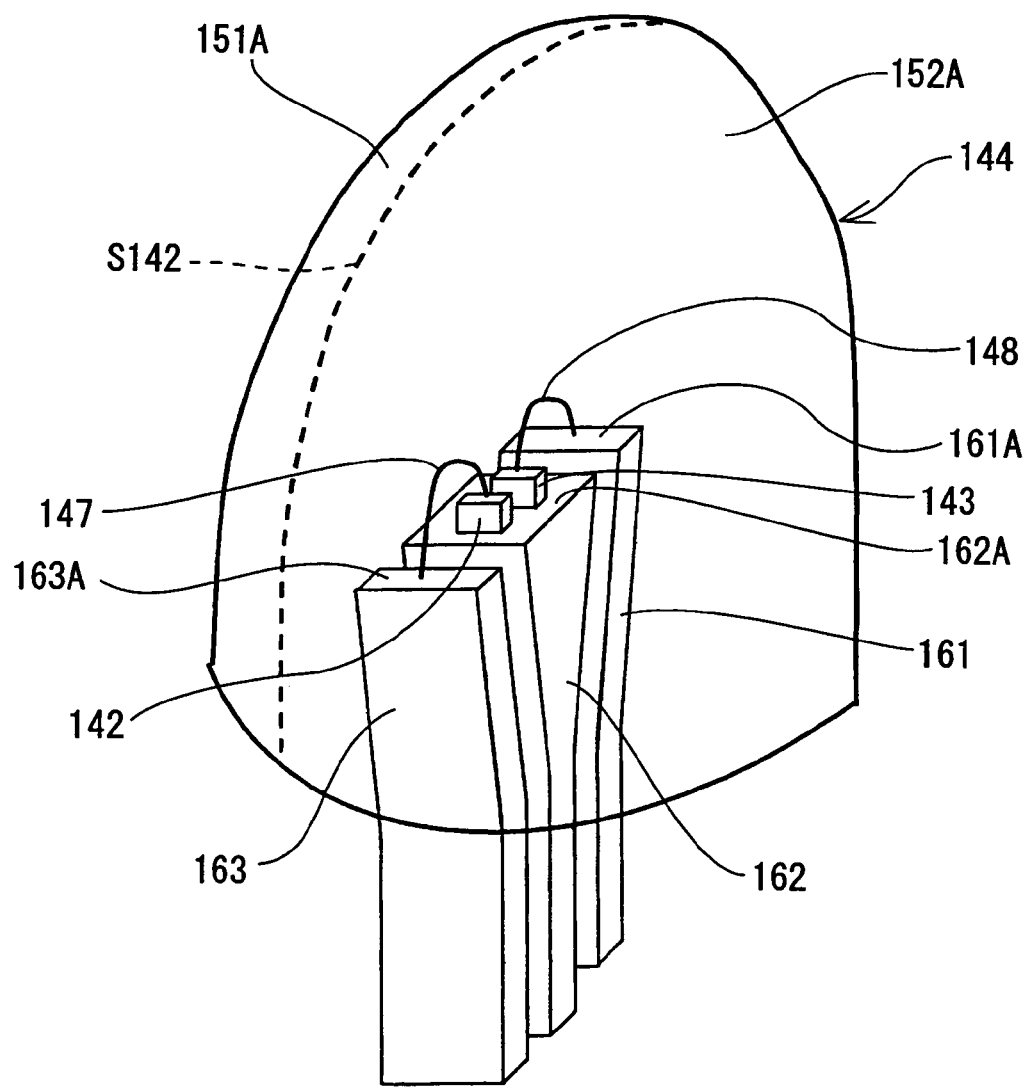
FIG. 16 is a perspective view of an LED lamp in an eleventh embodiment of the present invention.

Next, FIG. 16 shows an LED lamp in an eleventh embodiment of the present invention. The eleventh embodiment is different from the above-described ninth embodiment only in that instead of the lead frame 141 and the electrode leads 145, 146 of the ninth embodiment in FIG. 14, a lead frame 162 and electrode leads 163, 161 are provided.

In the eleventh embodiment, black surface treatment is applied to a mounting surface 162A of the lead frame 162 so as to make light reflectance of the mounting surface 162A 80% or less. The black surface treatment is also applied to surfaces 163A, 161A of the electrode leads 163, 161 so as to make light reflectance of the surfaces 163A, 161A 80% or less. LED chips 142, 143 are mounted on the mounting surface 162A, and the LED chip 142 is connected to the surface 163A of the electrode lead 163 through a connection wire 147. The LED chip 143 is connected to the surface 161A of the electrode lead 161 through a connection wire 148.

In the eleventh embodiment, light reflectance of the mounting surface 162A of the lead frame 162 is set to 80% or less, and light reflectance of the surfaces 163A, 161A of the electrode leads 163, 161 is set to 80% or less, which makes it possible to restrain outside rays of light having entered the convex lens 144 from reflecting on the mounting surface 162A and the surfaces 163A, 161A. Accordingly, it becomes possible to restrain outside rays of light incident upon the convex lens 144 from exiting from the convex lens 44 144, and to ensure prevention of misrecognition of an unlit diode lamp as being lit. As described above, in the eleventh embodiment, black surface treatment is applied to set reflectance of the mounting surface 162A of the lead frame 162 and the surfaces 163A, 161A of the electrode leads 163, 161 to be 80% or less. This is because reflectance over 80% does not provide a sufficient reflection inhibition effect.

Twelfth Embodiment

Figure 17:
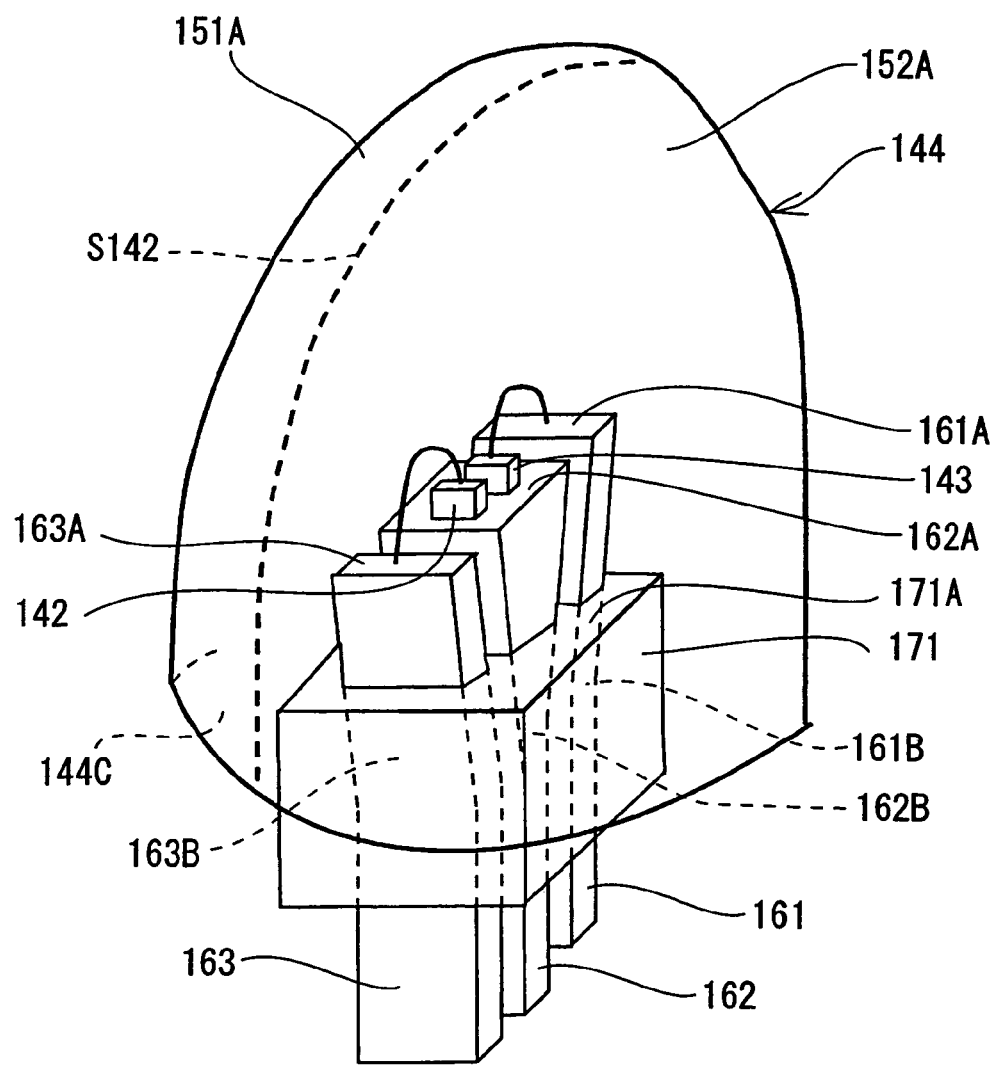
FIG. 17 is a perspective view of an LED lamp in a twelfth embodiment of the present invention.

Next, FIG. 17 shows an LED lamp in a twelfth embodiment of the present invention. The twelfth embodiment is different from the above-described eleventh embodiment only in the point that in a position retreated by a specified distance from the surfaces 162A, 163A and 161A of the lead frame 162 and of the electrode leads 163, 161 in the eleventh embodiment of FIG. 16 in a direction opposite from the light emitting direction, there is provided a black-color resin piece 171 that extends from the inside of the convex lens 144 beyond its bottom surface 144C to the outside.

A neck portion 162B of the lead frame 162, a bending portion 163B of the electrode lead 163, and a bending portion 161B of the electrode lead 161 are embedded in the black-color resin piece 171 such that those portions are surrounded by the black-color resin piece 171. The black-color resin piece 171 as a whole has an approximately cubic shape.

In the twelfth embodiment, a black-color front surface 171A of the black-color resin piece 171 defines back surfaces opposite to the mounting surface 162A of the lead frame 162, the surface 163A of the electrode lead 163, and the surface 161A of the electrode lead 161. Therefore in the twelfth embodiment, a contrast can be improved.

Thirteenth Embodiment

Figure 18:
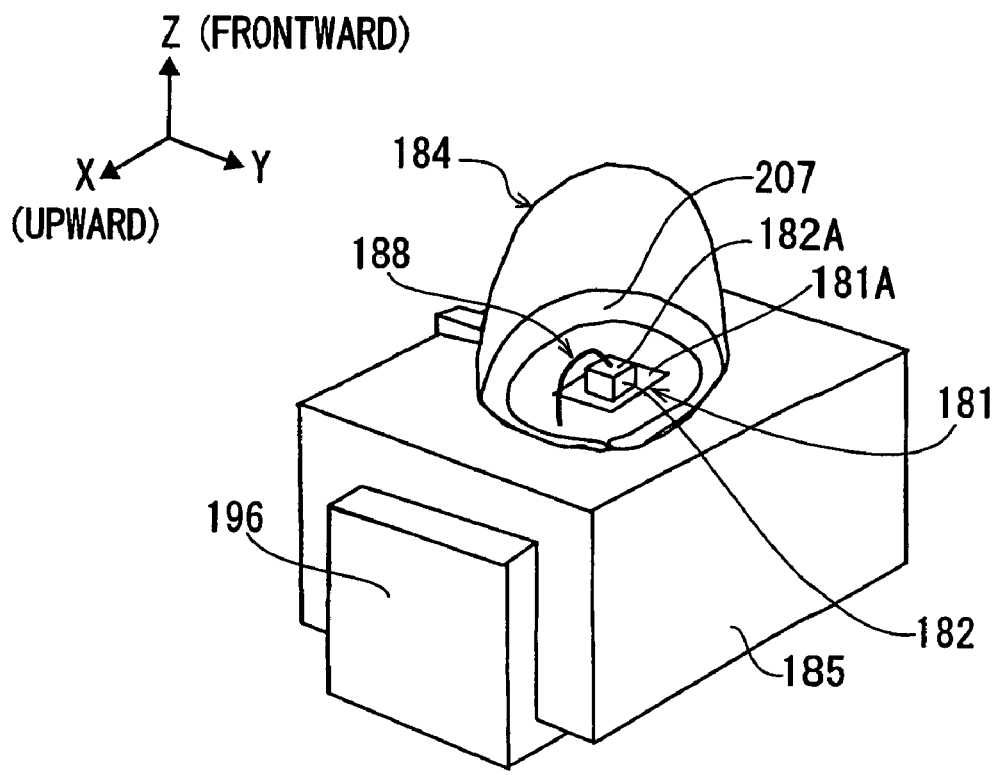
FIG. 18 is a perspective view of an LED lamp in a thirteenth embodiment of the present invention.

Next, FIG. 18 shows an LED lamp in a thirteenth embodiment of the present invention. In the thirteenth embodiment, an LED chip 182 is mounted on a mounting surface 181A of a lead frame 181, and the LED chip 182 is connected to an electrode lead 196 through a connection wire 188. The electrode lead 196 bends and extends from the bottom surface to a side surface of a resin body 185.

The LED chip 182 is embedded in a resin convex lens 184. The convex lens 184 is convex toward the light emitting direction of the LED chip 182. The LED lamp, during operation, uses the direction perpendicular to a light emitting surface 182A of the LED chip 182 as a frontward direction and the direction parallel to the light emitting surface 182A as an upward/downward direction. More specifically, in FIG. 18, the direction of an arrow-headed Z-axis denotes a frontward direction, the direction of an arrow-headed X-axis denotes an upward direction, and the direction of a Y-axis denotes a lateral direction. In this embodiment, the convex lens 184 is manufactured by transfer molding.

Figure 19:
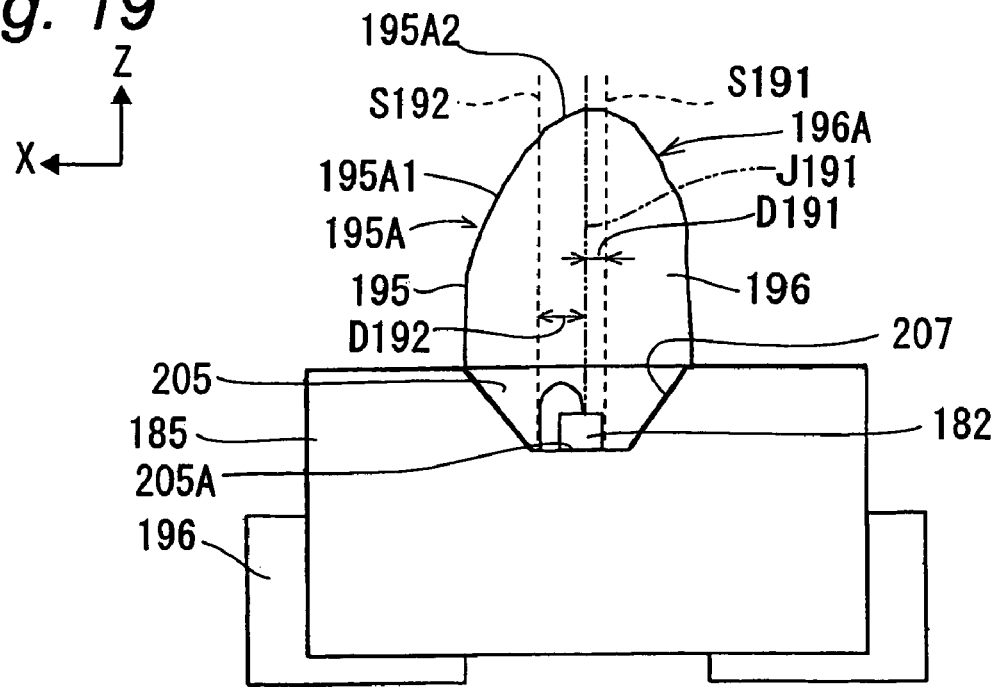
FIG. 19 is a longitudinal sectional view of the LED lamp in the thirteenth embodiment.

As shown in the sectional view of FIG. 19, in the thirteenth embodiment, the convex lens 184 is composed of an upper portion 195 and a lower portion 196 relative to the above-stated upward/downward direction, and the upper portion 195 and the lower portion 196 abut on each other in an interface plane S191. The interface plane S191 is a plane that is orthogonal to an extended surface of the light emitting surface 182A of the LED chip 182 and does not intersect with the LED chip 182.

The interface plane S191 is downwardly away from a central axis J191 of the light emitting surface 182A of the LED chip 182 by a distance D191 and is downwardly away from the LED chip 182. Also, an upper curved surface 195A of the upper portion 195 of the convex lens 184 is shaped so as to refract outgoing rays of light from the LED chip 182 more than a lower curved surface 196A of the lower portion 196 does. According to the thirteenth embodiment, therefore, as with the eighth to twelfth embodiments, during operation, it becomes possible to prevent the misrecognition that an LED chip 182 actually unlit is lit, due to incident rays of light from the outside such as afternoon light. Also, the interface plane S191 between the upper portion 195 and the lower portion 196 of the convex lens 184 is located lower than the central axis J191 by a size D191 (e.g., 0.2 mm), and is located below the LED chip 182. According to the thirteenth embodiment, therefore, it becomes possible to prevent outgoing rays of light from the LED chip 182 from being concentrated upon the interface plane S191 so as to prevent generation of an irregular light emitting peak at the front.

Also, in the thirteenth embodiment, as shown in FIG. 19, the LED chip 182 is disposed on a mounting surface 181A forming a bottom surface 205A of a cone-shaped hollow 205 of the resin body 185. A peripheral wall surface 207 of the hollow 205 serving as a reflection cup is black surface-treated so as to set light reflectance to 80% or less. The peripheral wall surface 207 constituting the reflection cup with reflectance of 80% or less is shaped such that a diameter thereof is increased toward the light emitting direction of the LED chip 182 so that the cone-shaped hollow is broadened toward the end. The black-colored peripheral wall surface 207 restrains outside rays of light incident having entered the convex lens 184 from being reflected and exiting from the convex lens 184 to the outside. That is, it is possible to inhibit a phenomenon that the reflection cup glows due to rays of light incident from the outside. This enables more reliable prevention of misrecognition of an unlit lamp as being lit. It is noted that in the thirteenth embodiment, the black surface treatment is applied to set reflectance of the peripheral wall surface 207 to 80% or less. This is because reflectance over 80% does not provide a sufficient reflection inhibition effect.

Also, in the thirteenth embodiment, like the eighth embodiment, the interface plane S191 between the upper curved surface 195A and the lower curved surface 196A is positioned below an optical axis J191, so that outgoing rays of light are collected in downward direction, as compared with the case where the interface plane S191 is positioned on or above the optical axis J191. Therefore, the LED lamp in the thirteenth embodiment is suitable for use in the LED display unit 201 for displaying road information such as traffic information as shown in FIG. 20. According to the LED display unit 201, it becomes possible to reduce reflection of sunlight at the display surface 203 and thereby prevent the misrecognition.

Further in the thirteenth embodiment, the upper curved surface 195A of the upper portion 195 of the convex lens 184 has a maximum curvature on the interface plane S192 located higher by a distance D192 (e.g., 2.0 mm) than the optical axis J191. In the thirteenth embodiment, it becomes possible to collect outgoing rays of light from the LED chip 182 to some degree onto the interface plane S192 to thereby regulate distribution of upward light.

Also, a first upper curved surface 195A1 of the upper curved surface 195A has a curvature smaller than that of a second upper curved surface 195A2, and is located above the second upper curved surface 195A2. In the upper curved surface 195A, the second upper curved surface 195A2 makes the transition to the first upper curved surface 195A1 at the interface plane S192 where the inclination of the upper curved surface 195A relative to a horizontal plane containing the Y axis and Z axis decreases abruptly. The presence of the first upper curved surface 195A1 enables increase of the luminous intensity distribution in the downward direction.

It should be understood that in the first to thirteenth embodiments, in addition to epoxy resin, desired transparent resin may be adopted as resin materials for the convex lens. Although in the eighth to thirteenth embodiments, the upper curved surface of the convex lens is composed of the first and second two upper curved surfaces, the upper curved surface may be composed of three or more curved surfaces different in shape. Further, the lower curved surface of the convex lens may be composed of a plurality of curved surfaces having different shapes to regulate the outgoing direction of rays of light emitted from the curved surface of the convex lens.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode lamp comprising:
a lead frame having a mounting portion, said lead frame having a center axis;
at least one light emitting diode chip mounted on the mounting portion of the lead frame and having an optical axis; and
a resin in which said at least one light emitting diode chip is encapsulated, said resin having a tip portion convexly curved forward in an emission direction of the light emitting diode chip such that the tip portion functions as a convex lens, wherein the optical axis of the at least one light emitting diode chip passes through said tip portion of the resin, and wherein the optical axis of the at least one light emitting diode chip coincides with or is parallel to the center axis of the lead frame, and the resin has, at at least the tip portion, at least three different curved surfaces, at least one on each side of a plane, wherein the plane is orthogonal to a light emitting surface of the light emitting diode chip, and either extends from a point on the light emitting surface other than a center of the light emitting surface or extends from a point on an extension of the light emitting surface and wherein the different curved surfaces are specified by different formulae, at least one of which expresses an ellipse having its center on an optical axis of the light emitting diode chip.

2. The light emitting diode lamp as defined in claim 1, wherein one of the curved surfaces of the resin is a curved surface that refracts outgoing rays of light from the light emitting diode chip more than the other curved surfaces of the convex lens.

3. The light emitting diode lamp as defined in claim 1, wherein the at least three curved surfaces of the resin are configured such that incoming sunlight refracted by one of the curved surfaces into the resin and then reflected upon the mounting portion of the lead frame is totally reflected by another of the curved surfaces.

4. A light emitting diode lamp comprising:
a plurality of light emitting diode chips; and
a convex lens through which rays of light emitted from the light emitting diode chips pass, wherein
the convex lens has at least three different curved surfaces, at least one on each side of an interface plane, wherein the interface plane is orthogonal to a light emitting surface of each light emitting diode chip, and either extends from a point on the light emitting surface other than a center of the light emitting surface or extends from a point on an extension of the light emitting surface and wherein the different curved surfaces are specified by different formulae, at least one of which expresses an ellipse having its center on an optical axis of the light emitting diode chip, and
the plurality of light emitting diode chips are arrayed in a lateral direction parallel to the interface plane.

5. A light emitting diode lamp comprising:
at least one light emitting diode chip; and
a convex lens through which rays of light emitted from the at least one light emitting diode chip pass, wherein the convex lens has at least three different curved surfaces, at least one on each side of a plane, wherein the plane is orthogonal to a light emitting surface of the light emitting diode chip, and either extending from a point on the light emitting surface other than a center of the light emitting surface or extending from a point on an extension of the light emitting surface, wherein the different curved surfaces are specified by different formulae, at least one of which expresses an ellipse having its center on an optical axis of the light emitting diode chip, and one of the curved surfaces of the convex lens refracts outgoing rays of light from the light emitting diode chip more than another of the curved surfaces of the convex lens.

6. The light emitting diode lamp as defined in claim 5, wherein the orthogonal plane does not intersect with the light emitting diode chip.

7. The light emitting diode lamp as defined in claim 5, comprising more than one light emitting diode chips, which are arrayed in one direction.

8. The light emitting diode lamp as defined in claim 5, wherein said at least one light emitting diode chip is molded by resin having light absorption band in a wavelengths other than a peak wavelength of rays of light emitted by the light emitting diode chip, and the resin constitutes the convex lens.

9. The light emitting diode lamp as defined in claim 5, wherein said at least one light emitting diode chip is mounted on a black surface-treated lead frame.

10. The light emitting diode lamp as defined in claim 5, further comprising a reflection cup surrounding at least a part of a periphery of the light emitting diode chip, and an inner peripheral surface of the reflection cup is black surface-treated.

11. The light emitting diode lamp as defined in claim 5, wherein black-colored resin is mounted on a lead frame on which the light emitting diode chip is mounted, the black-colored resin being positioned behind the light emitting diode chip.

12. A light emitting diode display unit comprising the light emitting diode lamp as defined in claim 5.

13. The light emitting diode lamp as defined in claim 5, wherein at least one of the at least three curved surfaces of the convex lens comprises a plurality of curved surfaces different in shape.

14. The light emitting diode lamp as defined in claim 13, wherein the plurality of curved surfaces include a curved surface on one side and a curved surface on the other side of a plane that is orthogonal to the extension of the light emitting surface of the light emitting diode chip and that does not intersect with the light emitting diode chip.

15. The light emitting diode lamp as defined in claim 13, comprising more than one light emitting diode chips, which are arrayed in one direction.

16. The light emitting diode lamp as defined in claim 15, wherein the light emitting diode chips are molded by resin having a light absorption band in wavelengths other than a plurality of wavelength peaks of rays of lights emitted by the light emitting diode chips, and the resin constitutes the convex lens.

17. The light emitting diode lamp as defined in claim 13, further comprising a reflection cup surrounding at least a part of a periphery of the light emitting diode chip, and an inner peripheral surface of the reflection cup is black surface treated.

18. The light emitting diode lamp as defined in claim 13, wherein black-colored resin is mounted on a lead frame on which the light emitting diode chip is mounted, the black-colored resin being positioned behind the light emitting diode chip.

19. A light emitting diode display unit comprising the light emitting diode lamp as defined in claim 13.

20. The light emitting diode lamp as defined in claim 13, wherein the at least one LED chip is mounted on a black surface-treated lead frame.

21. A light emitting diode lamp comprising:
a light emitting diode chip; and
a convex lens through which rays of light emitted from the light emitting diode chip pass, wherein
the convex lens has a plurality of curved surfaces having different shapes from each other,
the plurality of curved surfaces include first and second curved surfaces which abut on each other in an interface plane perpendicular to a light emitting surface of the light emitting diode chip or to an extension of the light emitting surface and extending off a center of the light emitting surface, and
the first and second curved surfaces have respective curved shapes in a plane that is perpendicular both to an X-Y plane which is the extension of the light emitting surface and to the interface surface and that contains an optical axis of the light emitting diode, and each of the curved shapes of the first and second curved surfaces is of an ellipse of which a major axis is given by the light emitting diode chip.

\* \* \* \* \*